US012727225B2

(12) United States Patent
Ho et al.

(10) Patent No.: US 12,727,225 B2
(45) Date of Patent: Sep. 1, 2026

(54) SEMICONDUCTOR DEVICE AND METHOD

(71) Applicant: Taiwan Semiconductor Manufacturing Co., Ltd., Hsinchu (TW)

(72) Inventors: Po-Kang Ho, Taoyuan (TW); Kuo-Ju Chen, Taichung (TW); Wei-Ting Chang, Hsinchu (TW); Wei-Fu Wang, Hsinchu (TW); Li-Ting Wang, Hsinchu (TW); Huicheng Chang, Tainan (TW); Yee-Chia Yeo, Hsinchu (TW); Yi-Chao Wang, Hsinchu (TW); Tsai-Yu Huang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 982 days.

(21) Appl. No.: 17/651,251

(22) Filed: Feb. 16, 2022

(65) Prior Publication Data

US 2023/0008413 A1 Jan. 12, 2023

Related U.S. Application Data

(60) Provisional application No. 63/219,882, filed on Jul. 9, 2021.

(51) Int. Cl.
*H10D 64/01* (2025.01)
*H10D 30/01* (2025.01)

(52) U.S. Cl.
CPC ......... *H10D 64/017* (2025.01); *H10D 30/024* (2025.01)

(58) Field of Classification Search
None
See application file for complete search history.

(56) References Cited

U.S. PATENT DOCUMENTS 10,720,529 B2 7/2020 Tsai et al.
2004/0266215 A1* 12/2004 Park ..................... H10D 64/035 257/E21.209
2007/0099404 A1* 5/2007 Govindaraju ......... H10P 30/204 257/E21.438
2017/0250282 A1* 8/2017 Wu ...................... H10D 30/797
2019/0140089 A1* 5/2019 Tsai ....................... H10D 30/62
2020/0006084 A1* 1/2020 Tsai ................... H10D 30/0245

FOREIGN PATENT DOCUMENTS

TW 201731105 A 9/2017
TW 202006824 A 2/2020

* cited by examiner

*Primary Examiner* — Dale E Page
*Assistant Examiner* — Derek L Nielsen
(74) *Attorney, Agent, or Firm* — Slater Matsil, LLP

(57) ABSTRACT

A method includes forming a fin protruding from a semiconductor substrate; forming a dummy gate stack over the fin, wherein forming the dummy gate stack includes depositing a layer of amorphous material over the fin; performing an anneal process on the layer of amorphous material, wherein the anneal process recrystallizes the layer of amorphous material into a layer of polycrystalline material, wherein the anneal process includes heating the layer of amorphous material for less than one millisecond; and patterning the layer of polycrystalline material; forming an epitaxial source/drain region in the fin adjacent the dummy gate stack; and removing the dummy gate stack and replacing the dummy gate stack with a replacement gate stack.

20 Claims, 31 Drawing Sheets

SEMICONDUCTOR DEVICE AND METHOD

PRIORITY CLAIM AND CROSS-REFERENCE

This application claims the benefit of U.S. Provisional Application No. 63/219,882 filed on Jul. 9, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
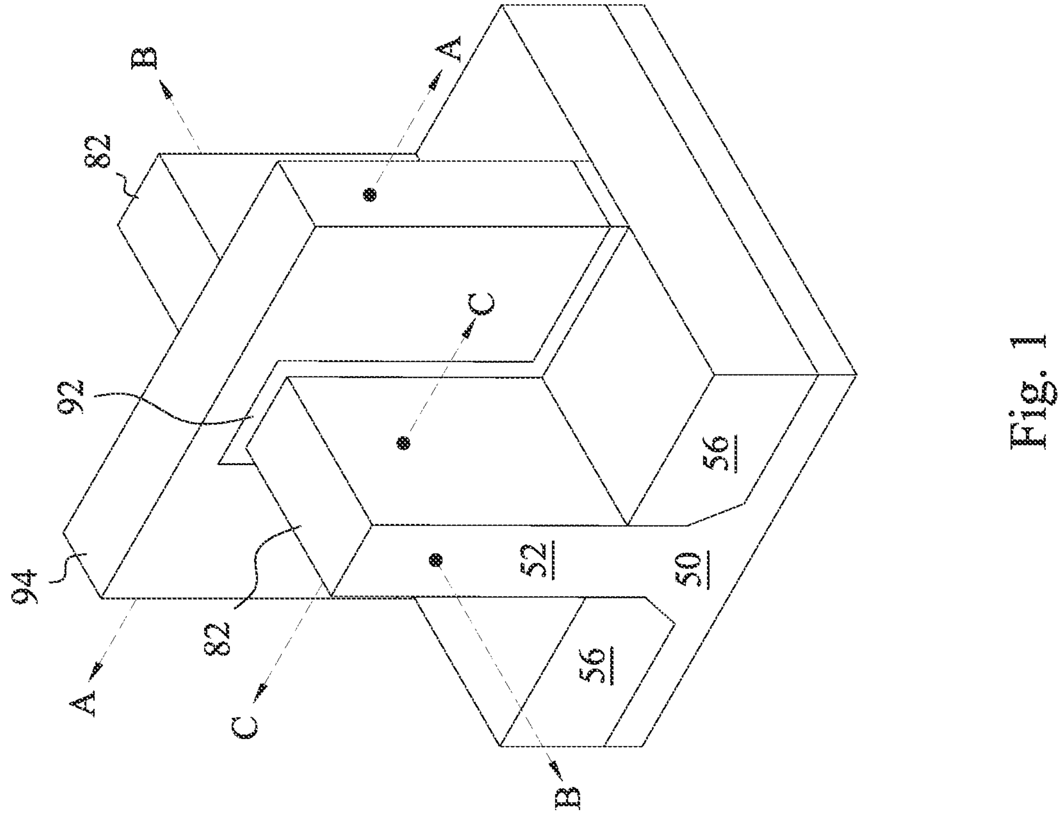
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe processes for forming gate stacks of a Fin Field-Effect Transistor (FinFET) device. Embodiments include forming dummy gate stacks by depositing a layer of amorphous material and then performing a "fast-ramp" anneal process to recrystallize the layer of amorphous material into a layer of polycrystalline material. The layer of polycrystalline material is then patterned to form the dummy gate stacks, which may be subsequently replaced by gate stacks. The fast-ramp anneal process described herein is a thermal process that heats the layer of amorphous material to a high temperature for a short duration of time (e.g., milliseconds or less). This recrystallizes the amorphous material into a polycrystalline material formed of small, similarly-sized crystalline grains throughout. The smaller and more uniform grains of this polycrystalline material can allow for improved etching control, such as reduced roughness, reduced linewidth variation, and more uniform sidewalls. In this manner, the layer of polycrystalline material may be patterned into dummy gate stacks that have a more uniform width and more uniform sidewalls. In some embodiments, a capping layer is formed over an amorphous material prior to the fast-ramp anneal process, which can promote the formation of small grains during recrystallization. The techniques described herein for forming a polycrystalline material can also be applied to forming features other than a dummy gate stack or for other types of transistors, such as planar transistors.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring (STI) regions 56. Although the (STI) regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring (STI) regions 56.

A gate dielectric layer 92 is along sidewalls and over a top surface of the fin 52, and a gate electrode 94 is over the gate dielectric layer 92. Epitaxial source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the epitaxial source/drain regions 82 of the FinFET. Cross-section B-B is perpendicular to cross-section A-A and is along a longitudinal axis of the fin 52 and in a direction of, for example, a current flow between the epitaxial source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like), field effect transistors (NSFETs), or the like.

FIGS. 2 through 21B are cross-sectional views of intermediate stages in the manufacturing of FinFETs, in accordance with some embodiments. FIGS. 2 through 10 illustrate reference cross-section A-A illustrated in FIG. 1, except for multiple fins/FinFETs. FIGS. 11A, 14A, 15A, 16A, 17A, 18A, 19A, 20A, and 21A are illustrated along reference cross-section A-A illustrated in FIG. 1, and FIGS. 11B, 14B, 15B, 16B, 17B, 18B, 19B, 20B, and 21B are illustrated along a similar cross-section B-B illustrated in FIG. 1, except for multiple fins/FinFETs. FIGS. 15C and 15D are illustrated along reference cross-section C-C illustrated in FIG. 1, except for multiple fins/FinFETs.

Figure 2:
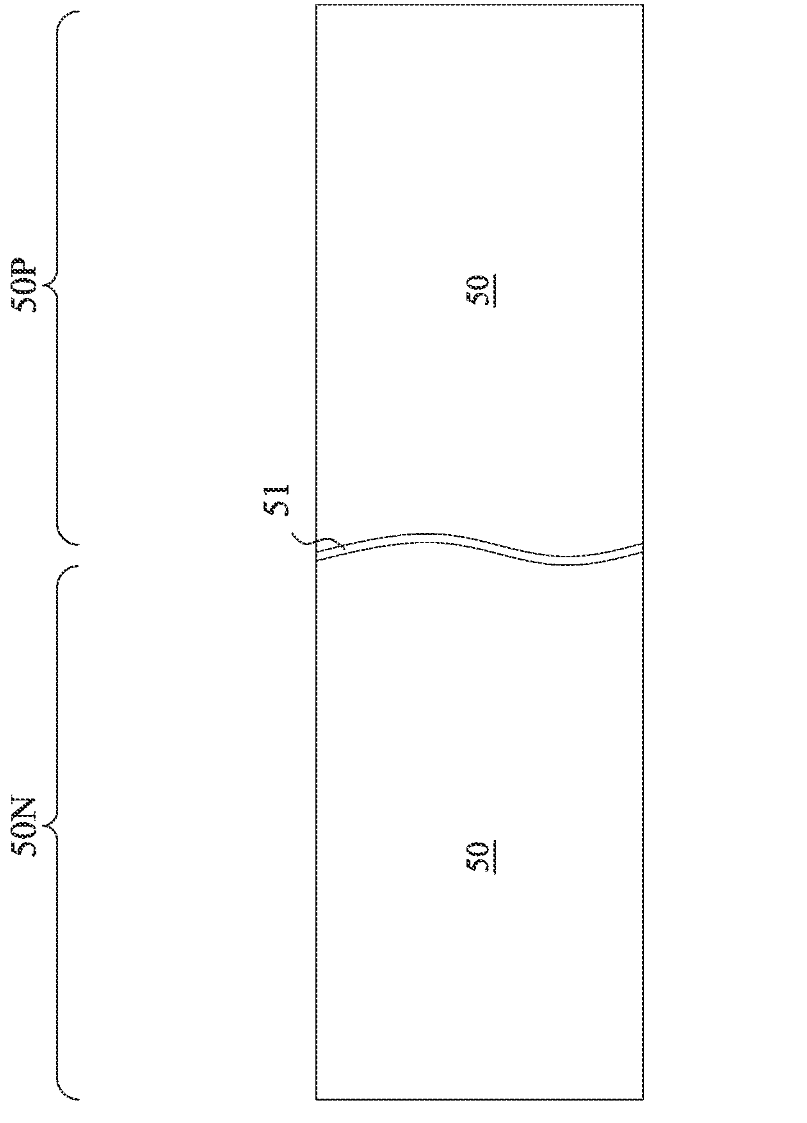
FIGS. 2, 3, 4, 5, 6, and 7 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
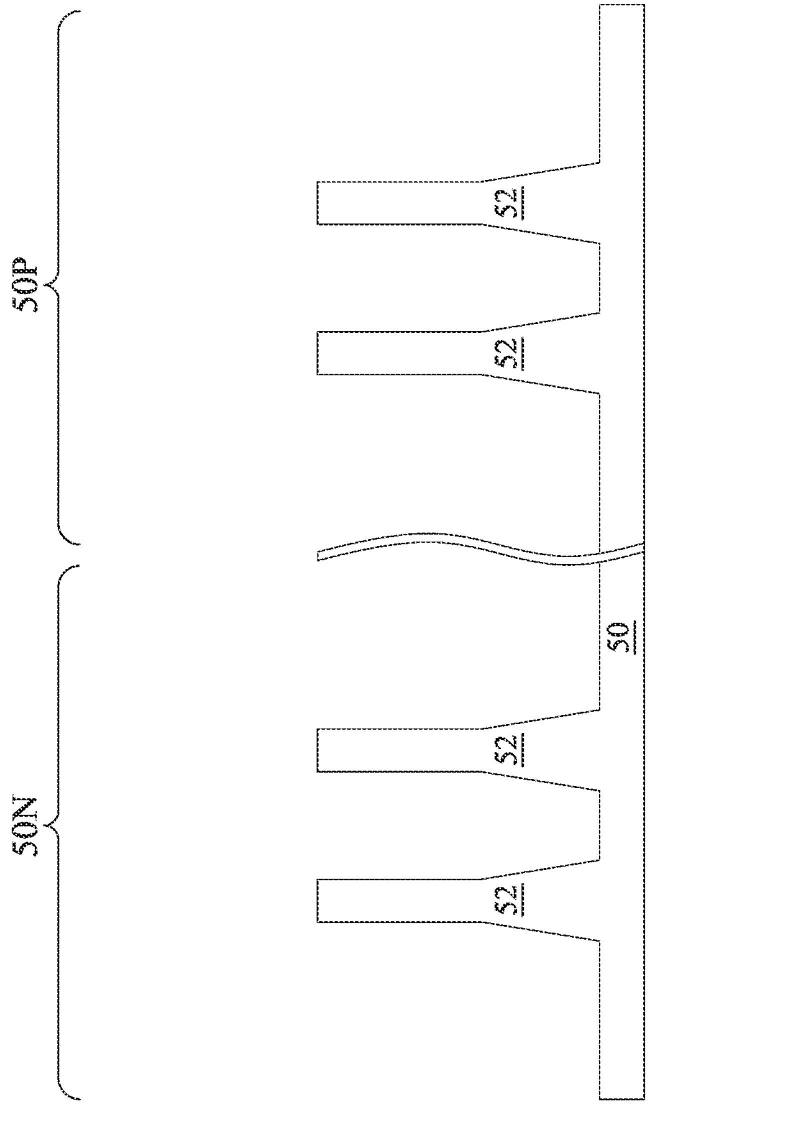

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

Figure 4:
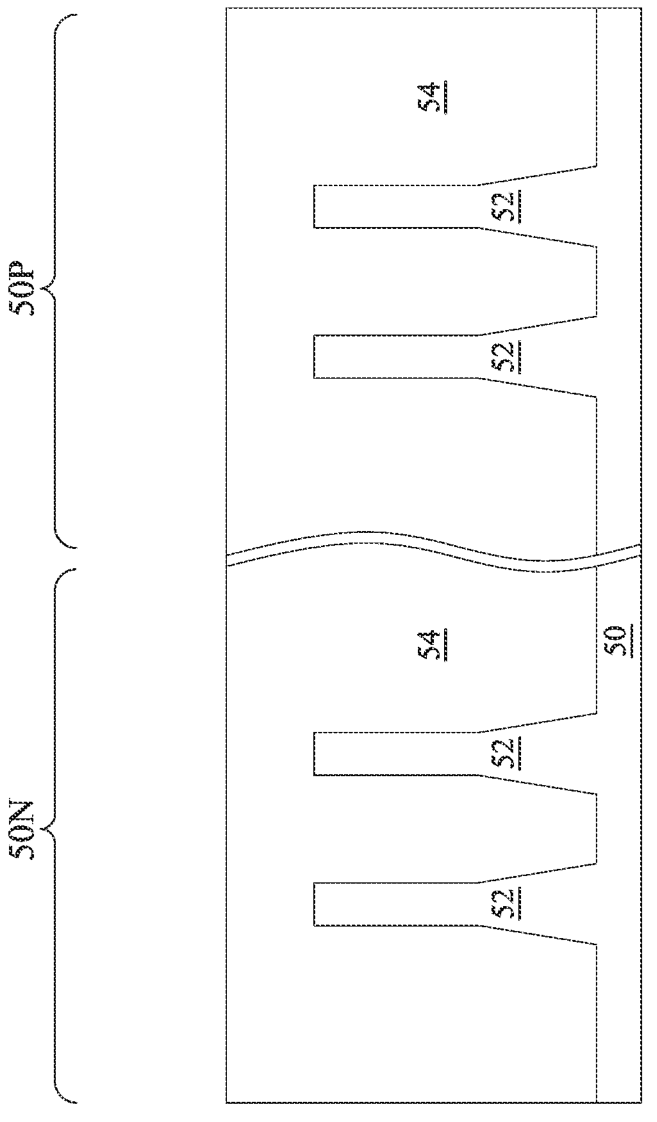

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
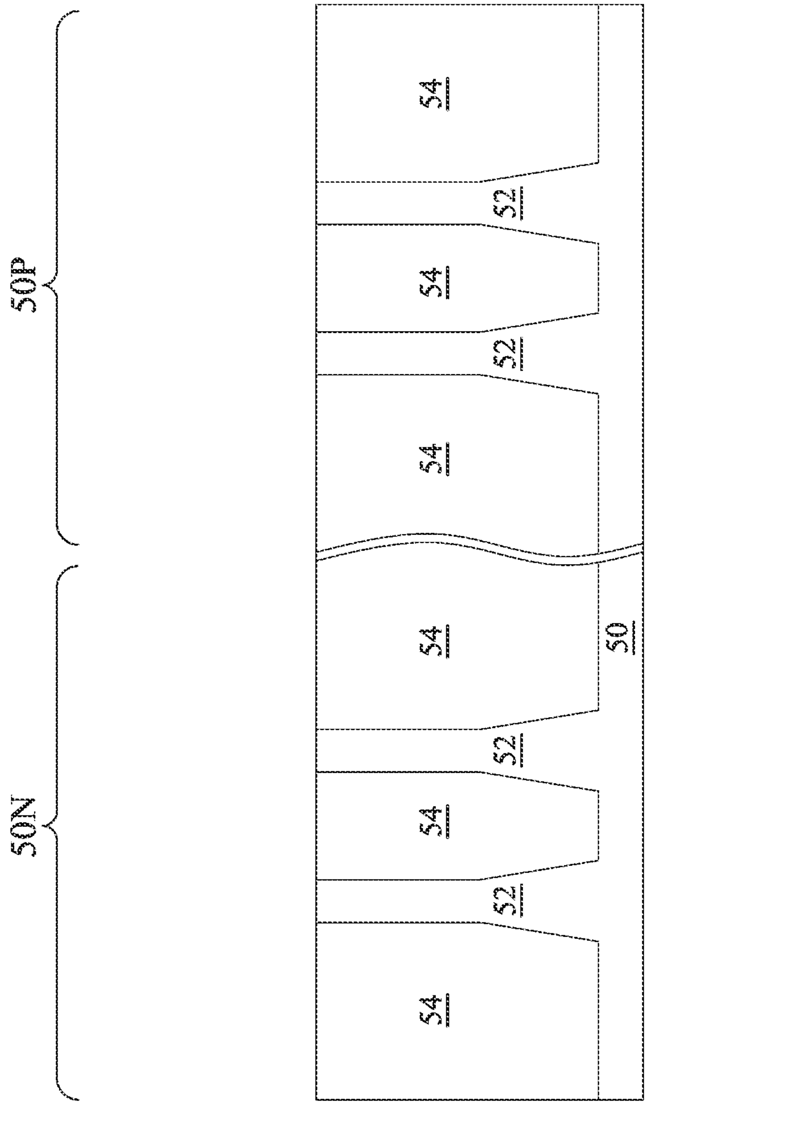

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
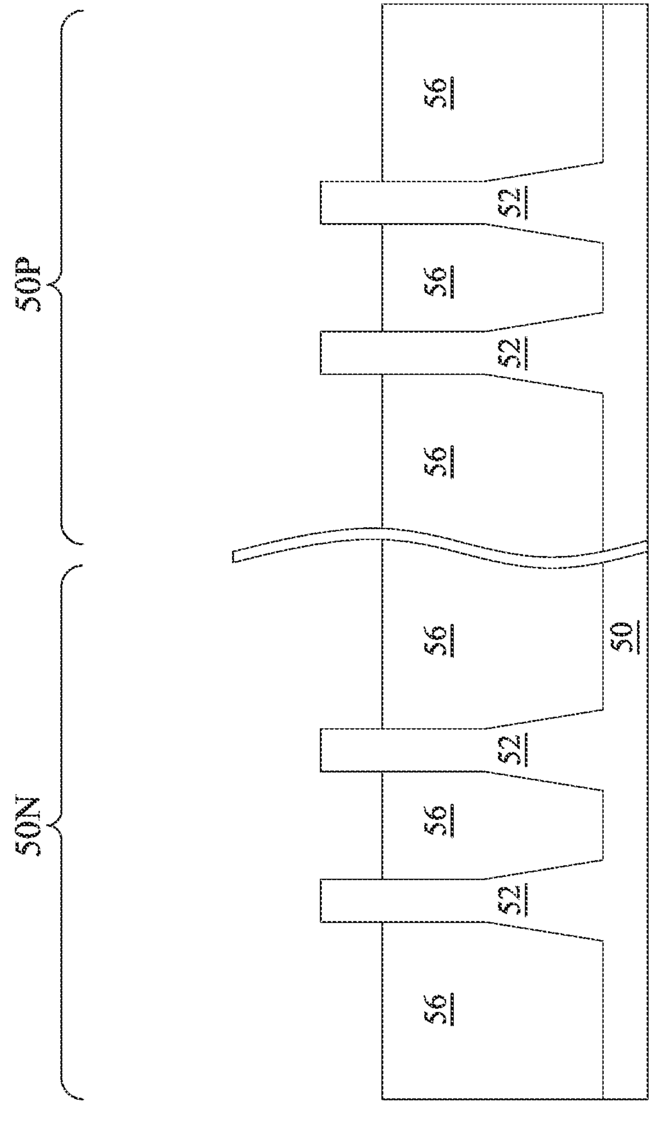

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal process using dilute hydrofluoric acid (dHF) may be used, though other processes are possible.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ $cm^{-3}$, such as between about $10^{16}$ cm' and about $10^{18}$ cm'. After the implant, the photoresist may be removed, such as by an acceptable ashing process.

After the implants of the n-type region 50N and the p-type region 50P, an anneal process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
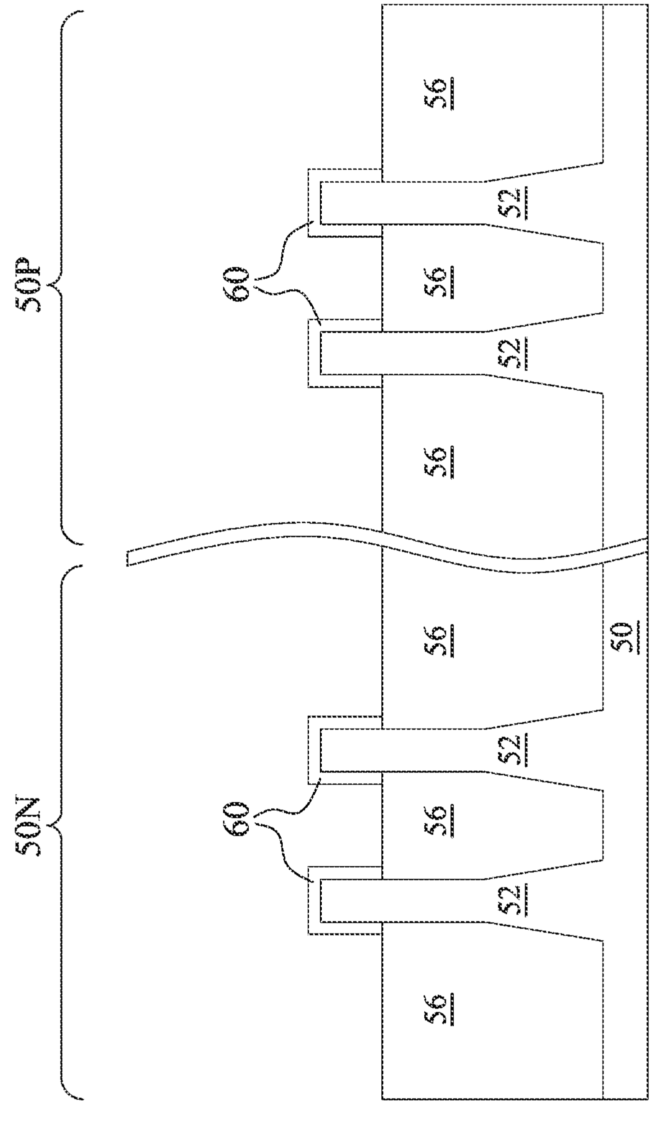

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions 56.

Figure 8:
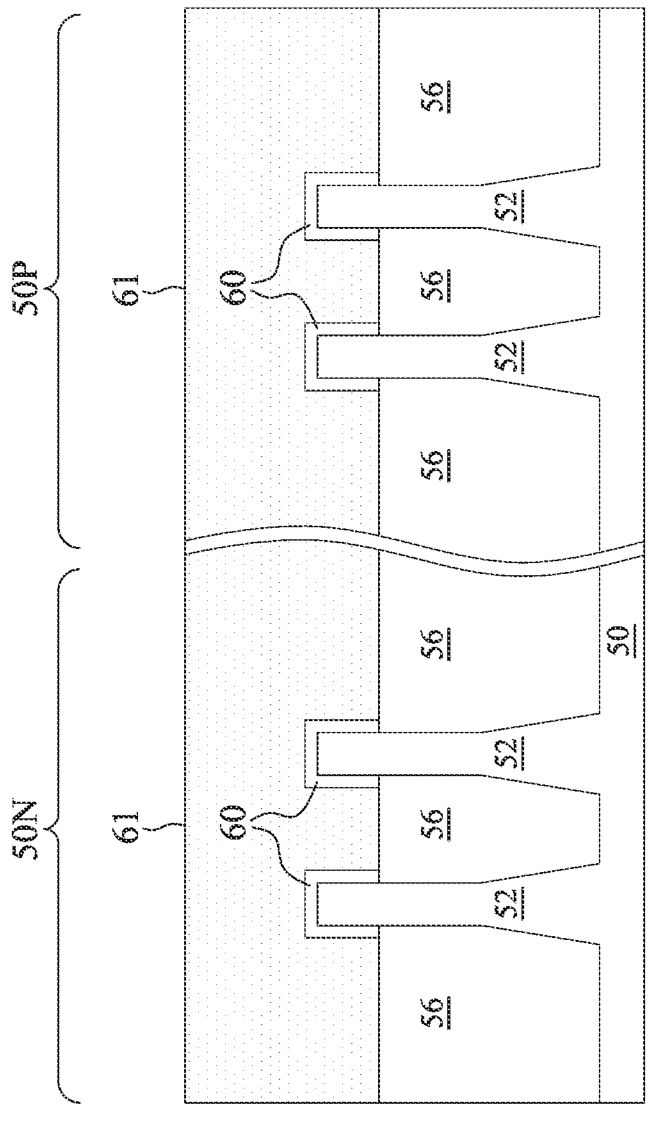
FIGS. 8, 9, 10, 11A, and 11B are cross-sectional views of intermediate stages in the manufacturing of dummy gate stacks of FinFETs, in accordance with some embodiments.
Figure 9:
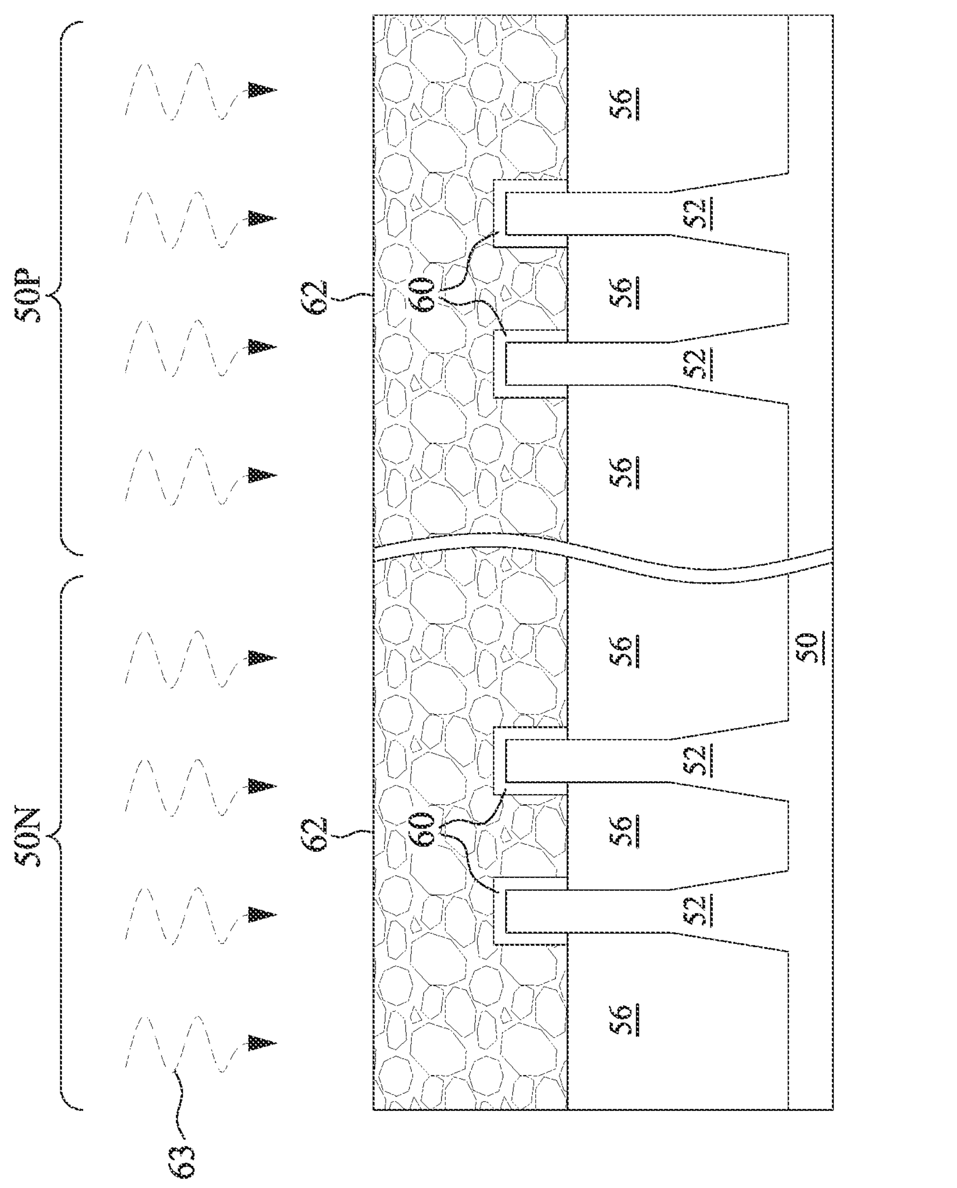

FIGS. 8 and 9 illustrate the formation of a dummy gate layer 62 comprising polycrystalline material, in accordance with some embodiments. In FIG. 8, an amorphous layer 61 is deposited over the dummy dielectric layer 60 (e.g., over the fins 52 and the STI regions 56). In some embodiments, the amorphous layer 61 may extend a height above top surfaces of the fins that is in the range of about 10 nm to about 100 nm, though other heights are possible.

The amorphous layer 61 comprises an amorphous material, such as an amorphous metal material, an amorphous metal oxide material, an amorphous high-k material, an amorphous metal silicide material, an amorphous semiconductor material, the like, or combinations thereof. For example, the amorphous layer 61 may comprise a metal such as copper, tungsten, the like, or alloys thereof; a metal oxide such as hafnium oxide, zirconium oxide, aluminum oxide, lanthanum oxide, the like, or combinations thereof; metal silicide such as titanium silicide (TiSi) or the like; or a semiconductor such as silicon, germanium, silicon germanium (SiGe), the like, or combinations thereof. Other materials or combinations of materials are possible. The amorphous layer 61 may be deposited using one or more suitable techniques, such as plasma vapor deposition (PVD), chemical vapor deposition (CVD), plasma-enhanced chemical vapor deposition (PECVD), atomic layer deposition (ALD), sputtering, or the like.

As an example, the amorphous layer 61 may comprise an amorphous layer of silicon deposited using low pressure chemical vapor deposition (LPCVD) or the like. The amorphous silicon may be deposited using precursors such as $SiH_4$, $Si_2H_6$, or the like, and a carrier gas such as $H_2$ may be used. In some embodiments, a process temperature in the range of about 450° C. to about 600° C. may be used, and a process pressure in the range of about 0.1 Torr to about 10 Torr may be used. This is an example, and other processes, parameters, precursors, or materials are possible.

In FIG. 9, a fast-ramp anneal process 63 is performed to form the dummy gate layer 62 from the amorphous layer 61, in accordance with some embodiments. In some embodiments, the fast-ramp anneal process 63 is a thermal process that recrystallizes the amorphous layer 61 from an amorphous material to a polycrystalline material. The recrystallized amorphous layer 61 is referred to herein as the dummy gate layer 62. The fast-ramp anneal process 63 may include one annealing step or multiple annealing steps.

In some embodiments, the fast-ramp anneal process 63 is an annealing process that quickly heats the amorphous layer 61 to a high temperature for a short duration of time. In some cases, the fast-ramp anneal process 63 may be called an "ultra-fast ramping anneal." The fast-ramp anneal process 63 may be performed using, for example, a laser annealing process or the like. The laser annealing process may use a laser wavelength in the range of about 100 nm to about 15 μm, though other wavelengths are possible. In some embodiments, the fast-ramp anneal process 63 may be performed in an ambient atmosphere comprising one or more gases, such as an atmosphere comprising nitrogen, argon, hydrogen, the like, or a combination thereof. The fast-ramp anneal process 63 may use a different process in other embodiments.

In some cases, a polycrystalline material deposited using a technique such as CVD, ALD, or the like can have a wide range of grain sizes. In some cases, the sizes and shapes of the grains formed in deposited polycrystalline material may be determined by the boundaries or shape of the structure. For example, a polycrystalline material deposited over fins in this manner may have grains of relatively smaller size in regions near the fins and grains of relatively larger size in regions away from the fins. In some cases, the grains of relatively larger size include long columnar grains that form over the fins during deposition (see FIG. 12B). The large variation in grain size and the formation of relatively larger grains can result in rougher sidewalls or less uniform etching, described in greater detail below for FIGS. 12A-13B.

The use of the fast-ramp anneal process 63 as described herein may form a dummy gate layer 62 of a polycrystalline material that has smaller grains of a more uniform shape and/or size. For example, the fast ramping and short duration of the fast-ramp anneal process 63 may recrystallize the amorphous layer 61 such that the regions of the dummy gate layer 62 near the fins 52 and the regions of the dummy gate layer 62 away from the fins 52 both have similar size distribution of grains. In other words, the use of the fast-ramp anneal process 63 can form a dummy gate layer 62 in which the grains of the dummy gate layer 62 are approximately the same size. The formation of smaller and more uniform grains can result in reduced sidewall roughness, improved feature definition, and more uniform etching, described in greater detail below for FIGS. 12A-13B.

In some cases, a polycrystalline material formed using the fast-ramp anneal process 63 may have grains that are between about 5% and about 10% of the size of the grains of a polycrystalline material formed using deposition techniques. In some embodiments, a polycrystalline material formed using the fast-ramp anneal process 63 may have an average grain size in the range of about 5 nm to about 50 nm. In some embodiments, the fast-ramp anneal process 63 may form a polycrystalline material having grains that are within ±8% of the average grain size. Other sizes or ranges of sizes are possible. In some embodiments, the size of the grains may be controlled by controlling the ramping rate and/or the duration of time of the fast-ramp anneal process 63. For example, a relatively slower ramping rate or a relatively longer duration of time may form relatively larger grains, in some cases.

In some embodiments, the temperature of the fast-ramp anneal process 63 is in the range of about 500° C. to about 1600° C., though other temperatures are possible. In some embodiments, the temperature ramping rate of the fast-ramp anneal process 63 is in the range of about 105° C./second to about 106° C./second, though other ramping rates are possible. In some embodiments, the fast-ramp anneal process 63 is performed for a duration of time that is in the range of about 0.1 milliseconds to about 1 millisecond, though other durations of time are possible. For example, in some embodiments, the fast-ramp anneal process 63 comprises increasing the annealing temperature at a rate greater than about 105° C./second to a final annealing temperature and then maintaining the final annealing temperature for between about 0.1 milliseconds and about 1 millisecond. In other embodiments, the fast-ramp anneal process 63 is performed for a duration of time that is greater than about 1 millisecond. The fast-ramp anneal process 63 may have other rates, temperatures, or times in other embodiments.

In some embodiments in which the amorphous layer 61 is a metal, metal alloy, or metal silicide, the fast-ramp anneal process 63 may have a temperature (e.g., a final annealing temperature) in the range of about 500° C. to about 800° C., and the resulting dummy gate layer 62 may have grain sizes in the range of about 5 nm to about 50 nm. In some embodiments in which the amorphous layer 61 is a metal oxide or high-k material, the fast-ramp anneal process 63 may have a temperature in the range of about 1100° C. to about 1600° C., and the resulting dummy gate layer 62 may have grain sizes in the range of about 5 nm to about 50 nm. In some embodiments in which the amorphous layer 61 is a semiconductor material, the fast-ramp anneal process 63 may have a temperature in the range of about 600° C. to about 1400° C. For example, in some embodiments in which the amorphous layer 61 is germanium, the fast-ramp anneal process 63 may have a temperature in the range of about 600° C. to about 800° C., and the resulting dummy gate layer 62 may have grain sizes in the range of about 5 nm to about 50 nm. In some embodiments in which the amorphous layer 61 is silicon, the fast-ramp anneal process 63 may have a temperature in the range of about 900° C. to about 1400° C., and the resulting dummy gate layer 62 may have grain sizes in the range of about 5 nm to about 50 nm. In some embodiments in which the amorphous layer 61 is silicon germanium, the fast-ramp anneal process 63 may have a temperature in the range of about 900° C. to about 1300° C., and the resulting dummy gate layer 62 may have grain sizes in the range of about 5 nm to about 50 nm. Other temperatures or grain sizes are possible.

Figure 10:
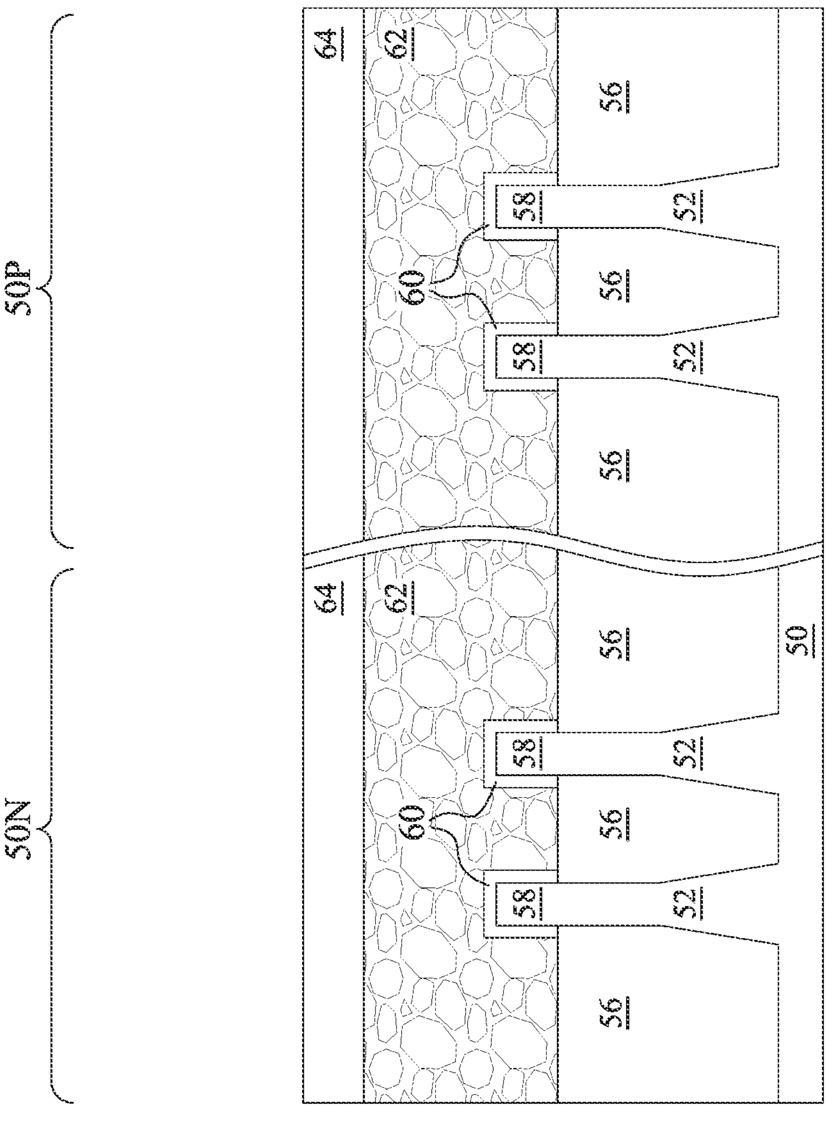

Turning to FIG. 10, a mask layer 64 may be deposited over the dummy gate layer 62, in accordance with some embodiments. The dummy gate layer 62 may be planarized prior to formation of the mask layer 64, in some embodiments. The mask layer 64 may include one or more layers of, for example, silicon nitride, silicon oxynitride, silicon carbide, the like, or combinations thereof. In this example, a single dummy gate layer 62 and a single mask layer 64 are formed across the n-type region 50N and the p-type region 50P.

FIGS. 11A through 21B illustrate various additional steps in the manufacturing of embodiment devices. FIGS. 11A through 21B illustrate features in either of the n-type region 50N and the p-type region 50P. For example, the structures illustrated in FIGS. 11A through 21B may be applicable to both the n-type region 50N and the p-type region 50P. Differences (if any) in the structures of the n-type region 50N and the p-type region 50P are described in the text accompanying each figure.

Figure 11B:
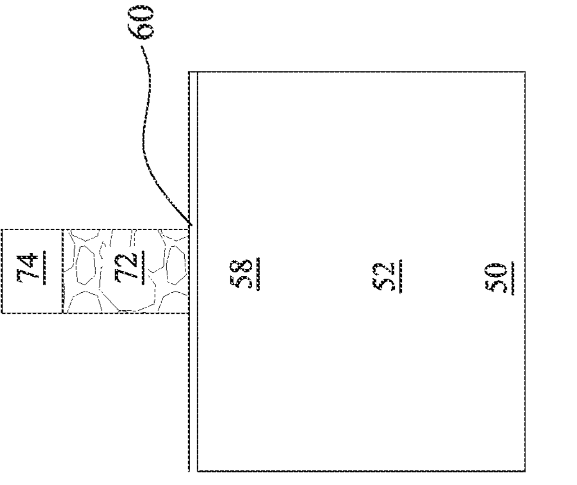
Figure 11A:
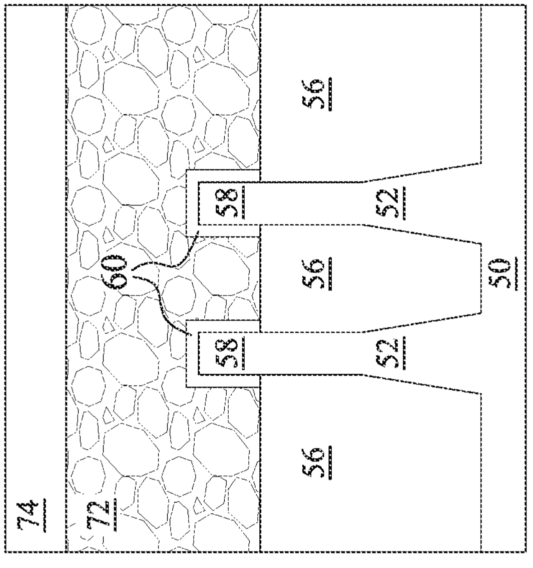

In FIGS. 11A and 11B, the mask layer 64 and the dummy gate layer 62 are patterned to form masks 74 and dummy gates 72, in accordance with some embodiments. The masks 74 and the dummy gates 72 may be collectively referred to as a "dummy gate stack." The mask layer 64 may be patterned using acceptable photolithography and etching techniques to form masks 74. The pattern of the masks 74 then may be transferred to the dummy gate layer 62 using an acceptable etching technique, such as an anisotropic dry etch and/or an anisotropic wet etch. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective epitaxial fins 52.

Figures 12A, 12B, 13A, 13B:
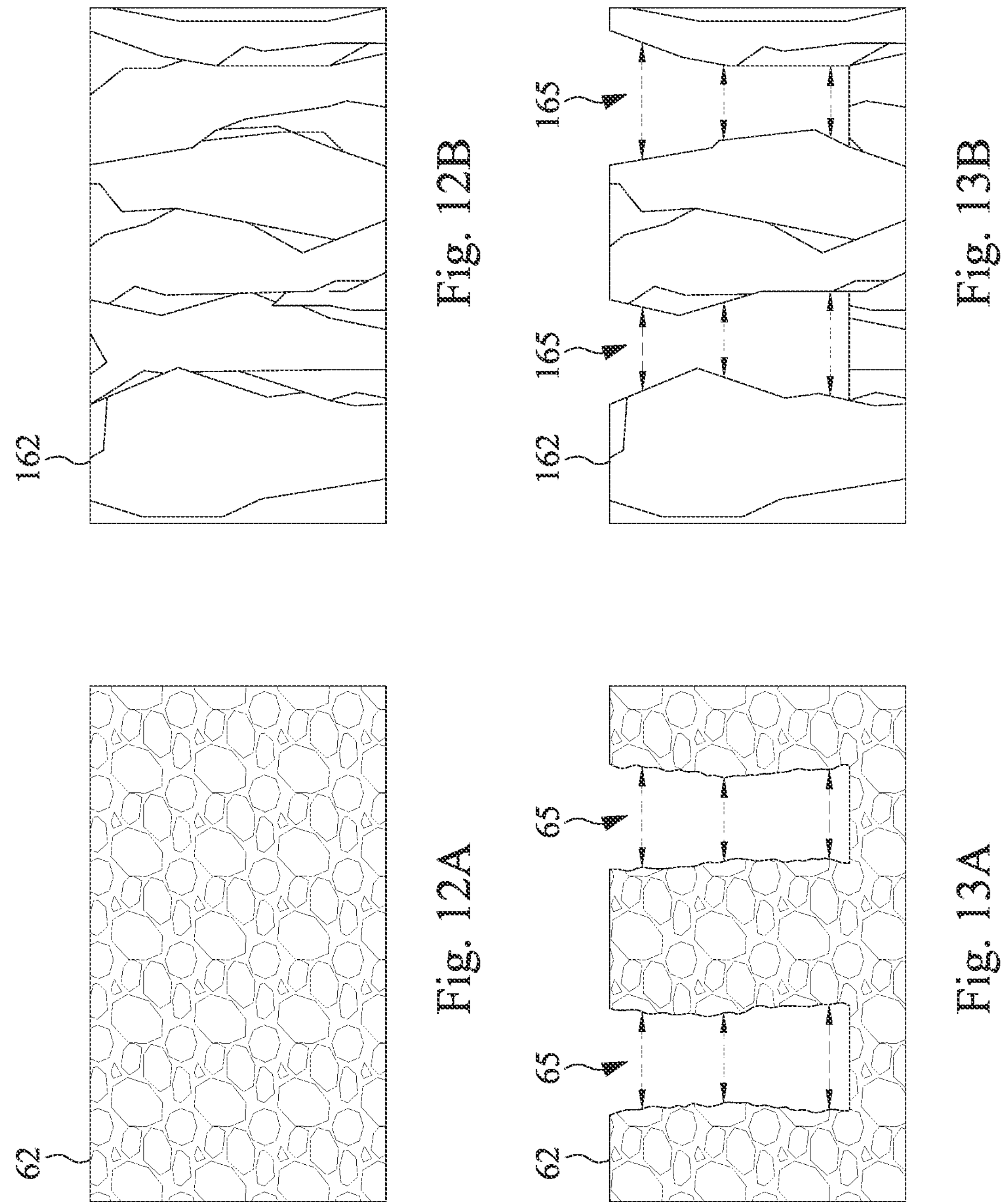
FIGS. 12A, 12B, 13A, and 13B are cross-sectional views of intermediate stages in the etching of polycrystalline layers, in accordance with some embodiments.

In some cases, the formation of a polycrystalline dummy gate layer 62 having small, uniform grains as described herein can allow for improved etching of the dummy gate layer 62. As illustrative examples, FIGS. 12A-13B show the etching of a polycrystalline dummy gate layer 62 having small, uniform grains and the etching of a polycrystalline dummy gate layer 162 having large, irregular grains. FIG. 12A shows a dummy gate layer 62 formed, for example, using the fast-ramp anneal process 63 to recrystallize an amorphous layer 61, as described previously for FIG. 9. FIG. 12B shows a dummy gate layer 162 formed, for example, by deposition of the polycrystalline material using a related process, such as PVD, CVD, or the like. The dummy gate layer 162 may have regions of relatively large grains, such as the long columnar grains shown in FIG. 12B.

FIGS. 13A and 13B illustrate the dummy gate layer 62 and the dummy gate layer 162 after an anisotropic etching process has been performed, which may be similar to the etching process used to form the dummy gates 72 described for FIGS. 11A and 11B. The etching process forms example recesses 65 in the dummy gate layer 62 and example recesses 165 in the dummy gate layer 162. As shown in FIGS. 13A and 13B, the etching process can form recesses 65 and 165 having sidewalls that approximately follow the contours of the pre-existing grain structure. In some cases, this may be due to different crystalline orientations within the polycrystalline material having different etch rates. In this manner, the smaller, more uniform grains of the dummy gate layer 62 can reduce the effect of the grain structure during the etching process. This is shown in FIGS. 13A and 13B, in which the sidewalls of the recesses 65 have more uniform profiles than the sidewalls of the recesses 165. As indicated by the arrows in FIGS. 13A and 13B, the recesses 65 also have less width variation than the recesses 165. Thus, the use of the "small-grain" dummy gate layer 62 as described herein can allow for improved reproducibility, uniformity, or linewidth control of patterned features such as dummy gates 7472 or the like. The use of small-grain dummy gate layer 62 can also reduce linewidth roughness and/or line edge roughness, in some cases. In some embodiments, the techniques described herein allow for a linewidth roughness that is less than about 2 nm, though other values are possible. In some cases, the techniques described herein can allow for sidewalls of the dummy gate layer 62 having a surface roughness that is less than about 10 nm. In this manner, smaller feature sizes may be patterned without increasing the risk of shorts or process defects due to roughness or poor linewidth control.

Figure 14B:
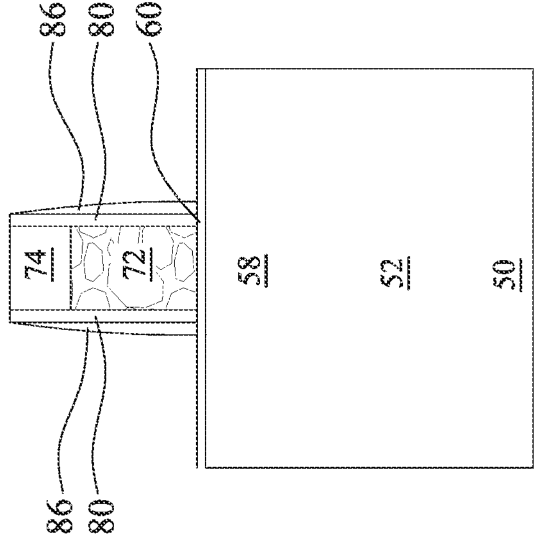
FIGS. 14A, 14B, 15A, 15B, 15C, 15D, 16A, 16B, 17A, 17B, 18A, 18B, 19A, 19B, 19C, 20A, 20B, 21A, and 21B are cross-sectional views of intermediate stages in the manufacturing of FinFETs, in accordance with some embodiments.
Figure 14A:
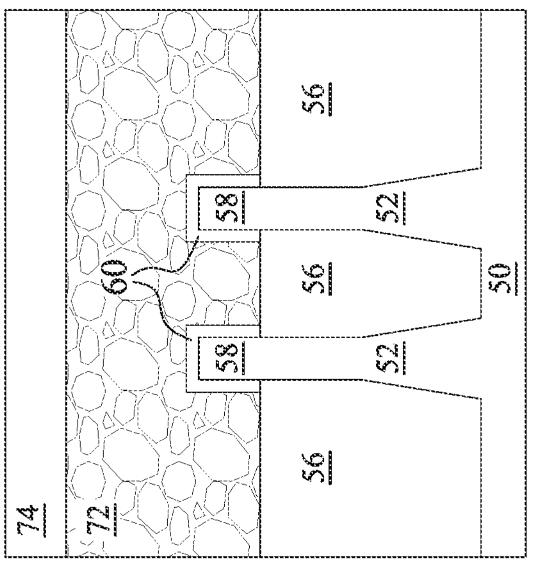

In FIGS. 14A and 14B, gate seal spacers 80 are formed on exposed surfaces of the dummy gates 72, the masks 74, and/or the fins 52, in accordance with some embodiments. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about 1015 cm-3 to about 1019 cm-3. An anneal process may be used to repair implant damage and to activate the implanted impurities.

Still referring to FIGS. 14A and 14B, gate spacers 86 are formed on the gate seal spacers 80 along sidewalls of the dummy gates 72 and the masks 74, in accordance with some embodiments. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. The gate spacers 86 may be formed from one layer of insulating material or from multiple layers of various insulating materials.

It is noted that the above disclosure generally describes a process of forming spacers and LDD regions. Other processes and sequences may be used. For example, fewer or additional spacers may be utilized or different sequence of steps may be utilized (e.g., the gate seal spacers 80 may not be etched prior to forming the gate spacers 86 which may yield "L-shaped" gate seal spacers, spacers or layers thereof may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 15B:
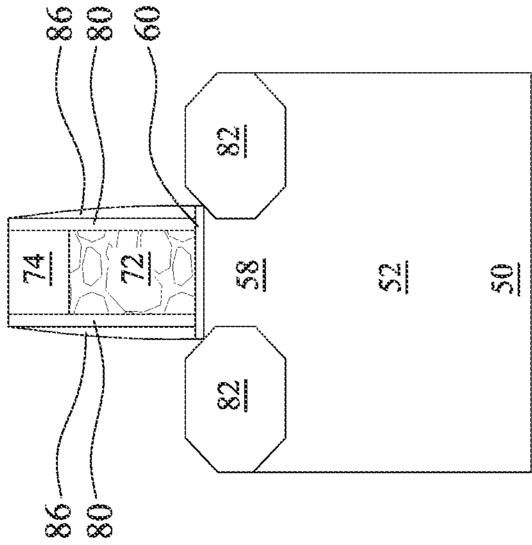
Figure 15A:
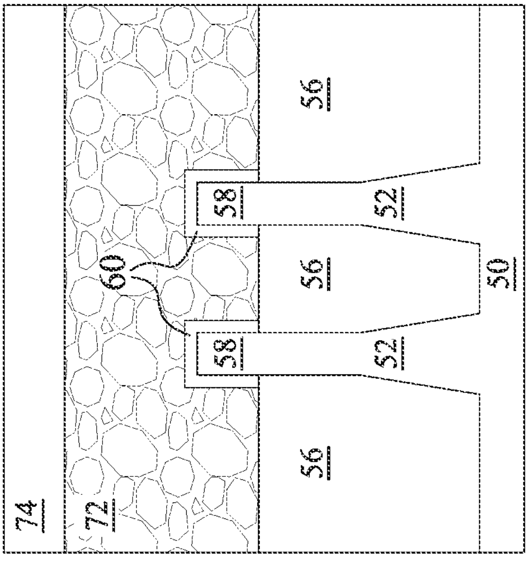
Figure 15D:
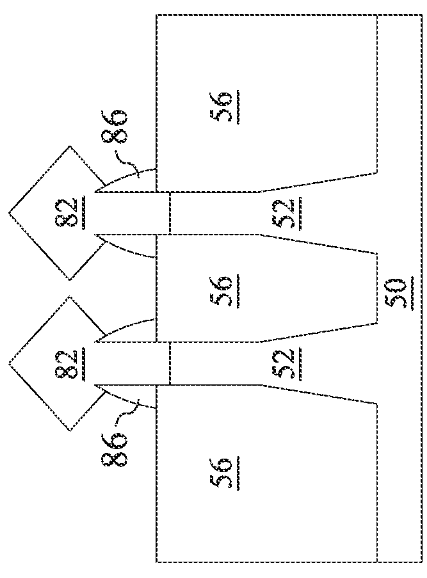
Figure 15C:
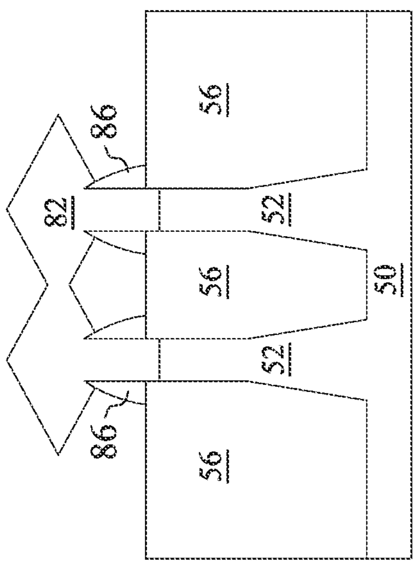

In FIGS. 15A and 15B, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed, for example, by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous-doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon germanium, boron-doped silicon germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal process. The source/drain regions may have an impurity concentration of between about 1019 cm-3 and about 1021 cm-3. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions 82 have facets which expand laterally outward beyond sidewalls of the fins 52. In some embodiments, these facets cause adjacent epitaxial source/drain regions 82 of a same FinFET to merge as illustrated by FIG. 15C. In other embodiments, adjacent source/drain regions 82 remain separated after the epitaxy process is completed as illustrated by FIG. 15D. In the embodiments illustrated in FIGS. 15C and 15D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 16B:
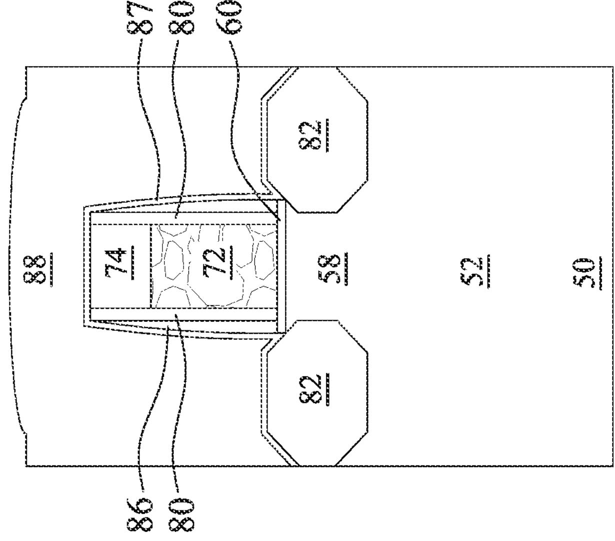
Figure 16A:
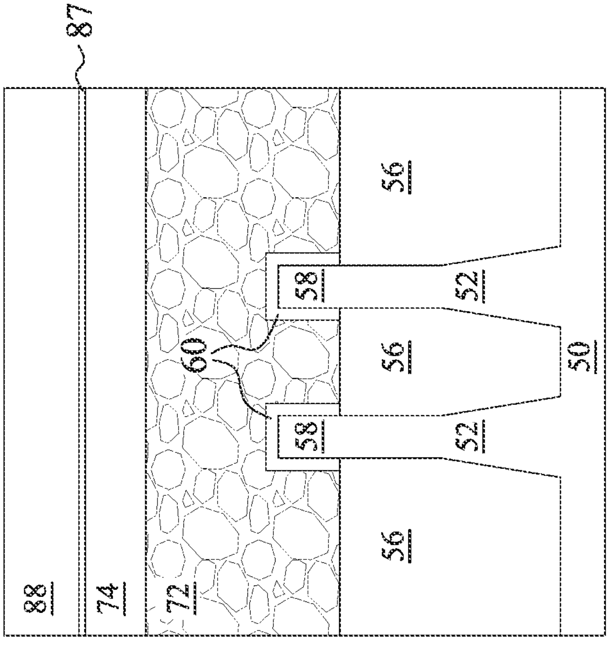

In FIGS. 16A and 16B, a first interlayer dielectric (ILD) 88 is deposited over the structure illustrated in FIGS. 15A and 15B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 17B:
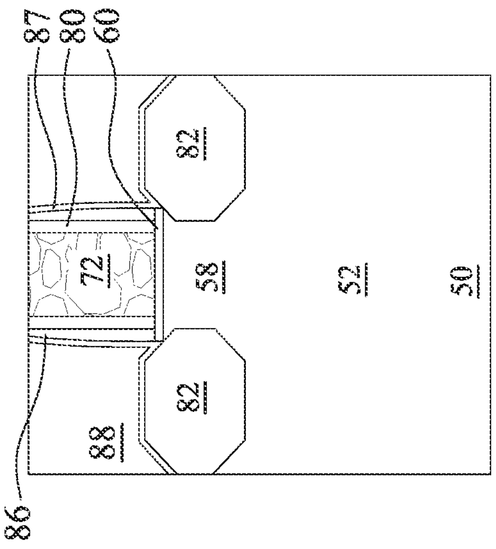
Figure 17A:
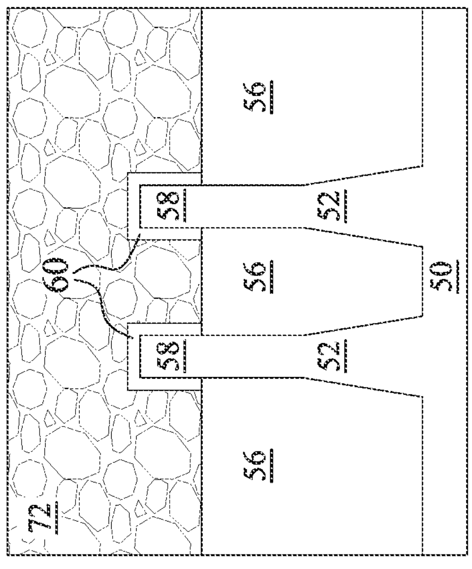

In FIGS. 17A and 17B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 18B:
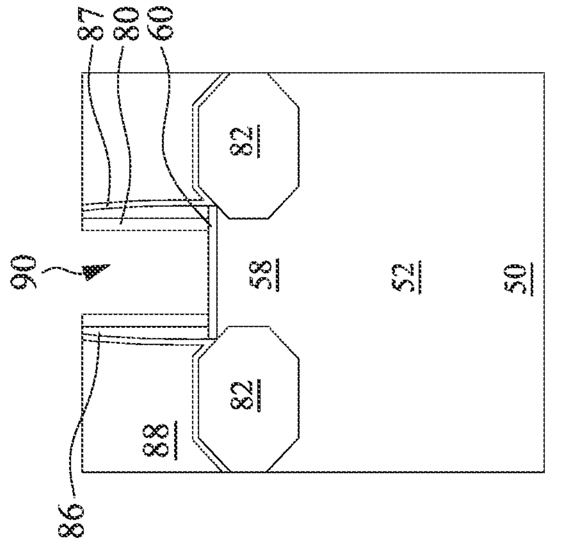
Figure 18A:
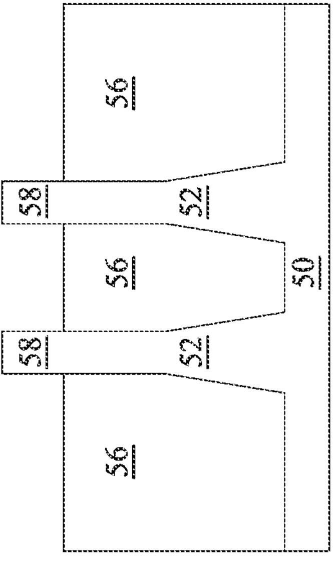

In FIGS. 18A and 18B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 19B:
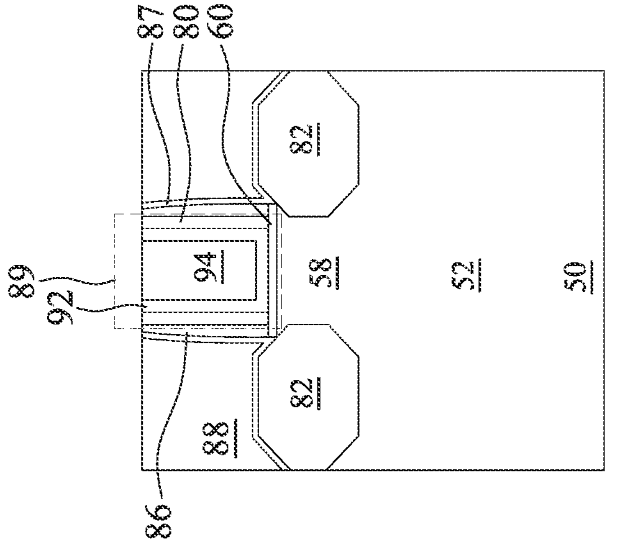
Figure 19A:
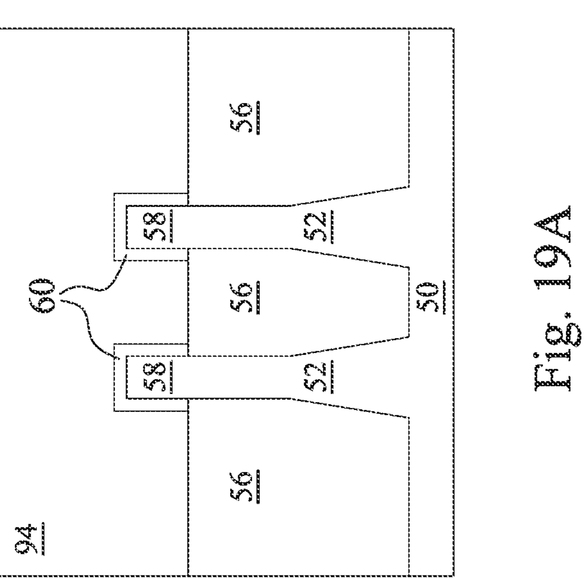
Figure 19C:
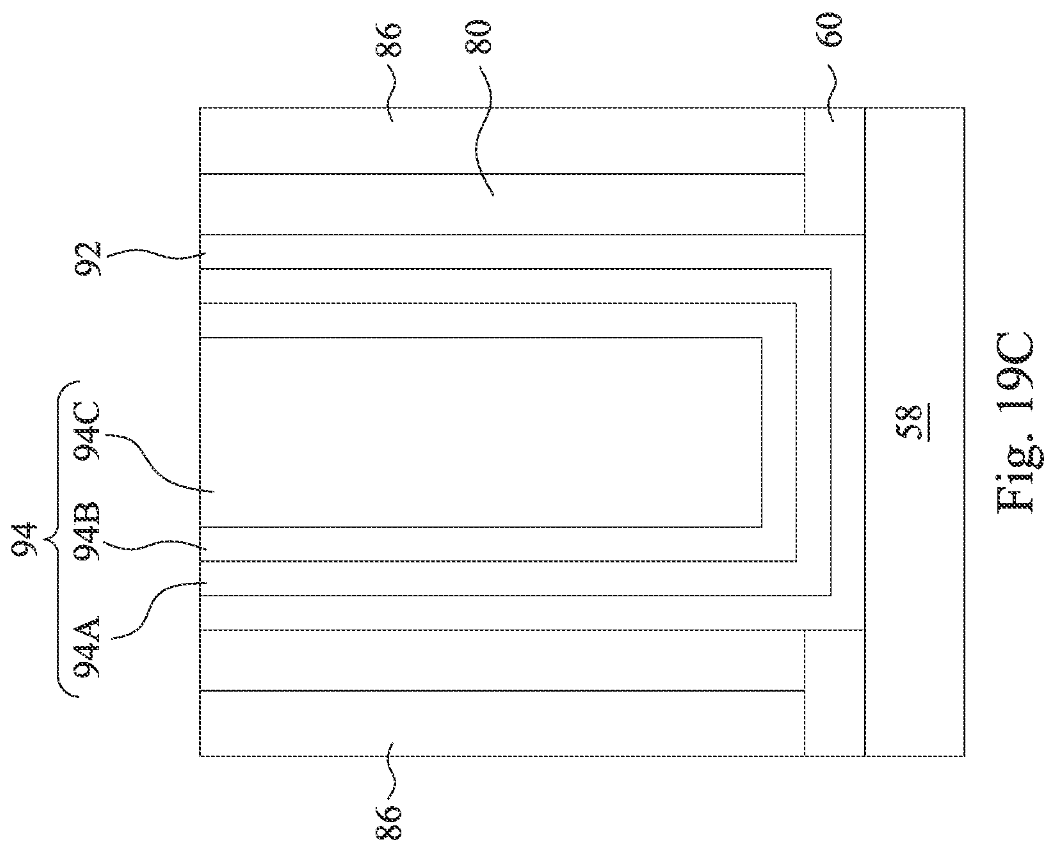

In FIGS. 19A and 19B, gate dielectric layers 92 and gate electrodes 94 are formed for replacement gates. FIG. 19C illustrates a detailed view of region 89 of FIG. 19B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments in which portions of the dummy dielectric layer 60 remain in the recesses 90, the gate dielectric layers 92 may include a material of the dummy dielectric layer 60 (e.g., silicon oxide or the like).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 19B, the gate electrode 94 may comprise any number of liner layers 94A, any number of work function tuning layers 94B, and a fill material 94C as illustrated by FIG. 19C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "replacement gate," a "gate structure," or a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 20B:
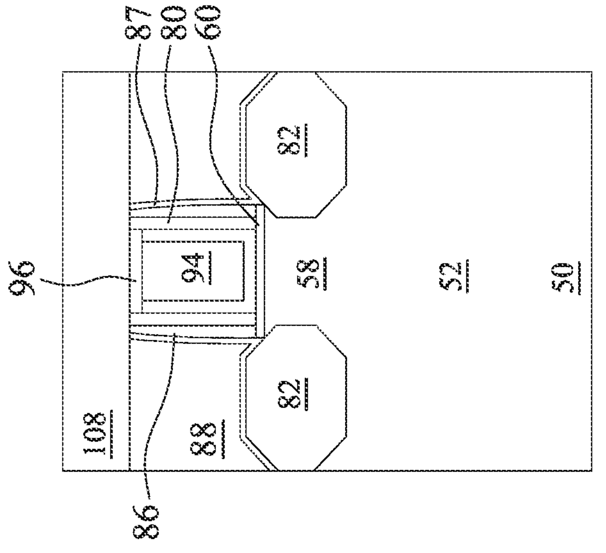
Figure 20A:
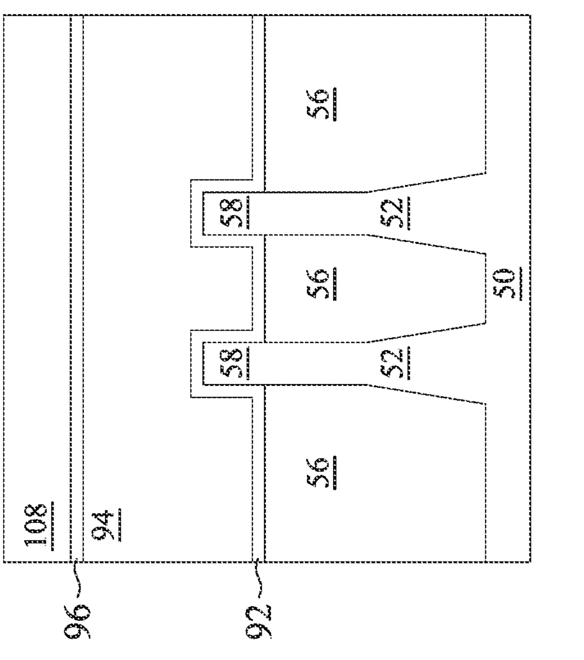

In FIGS. 20A and 20B, a gate mask 96 is formed over the gate stack (including a gate dielectric layer 92 and a corresponding gate electrode 94), and the gate mask 96 may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 20A and 20B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 21A and 21B) penetrate through the second ILD 108 and the gate mask 96 (if present) to contact the top surface of the recessed gate electrode 94.

Figure 21B:
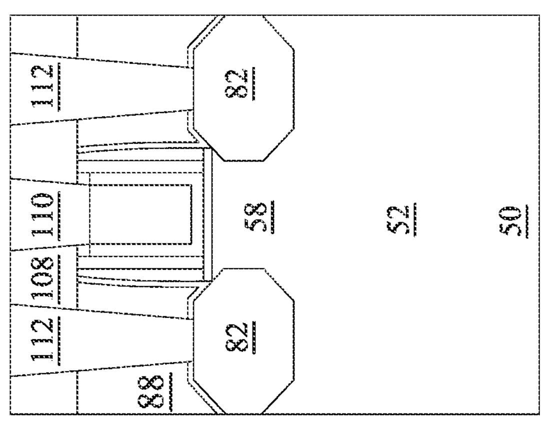
Figure 21A:
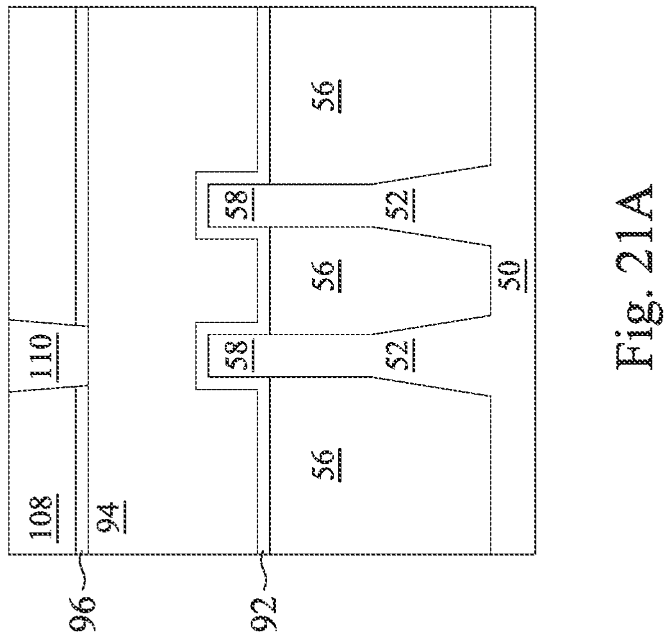

In FIGS. 21A and 21B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

FIGS. 22 through 30B illustrate cross-sectional views of intermediate steps in the manufacturing of FinFETs, in accordance with some embodiments. For example, FIGS. 22 through 29B illustrate the formation of a hybrid-grain dummy gate 207 (see FIGS. 29A-29B) using a hybrid-grain layer 205 (see FIG. 25), in accordance with some embodiments. FIGS. 22 through 26 illustrate reference cross-section A-A in an n-type region 50N and a p-type region 50P, similar the cross-sectional view of FIGS. 2 through 10. For example, the structures illustrated in FIGS. 22 through 30B may be applicable to both the n-type region 50N and the p-type region 50P. Differences (if any) in the structures of the n-type region 50N and the p-type region 50P are described in the text accompanying each figure. FIGS. 27A, 28A, 29A, 30A are illustrated along reference cross-section A-A, and FIGS. 27B, 28B, 29B, 30B are illustrated along reference cross-section B-B.

Figure 22:
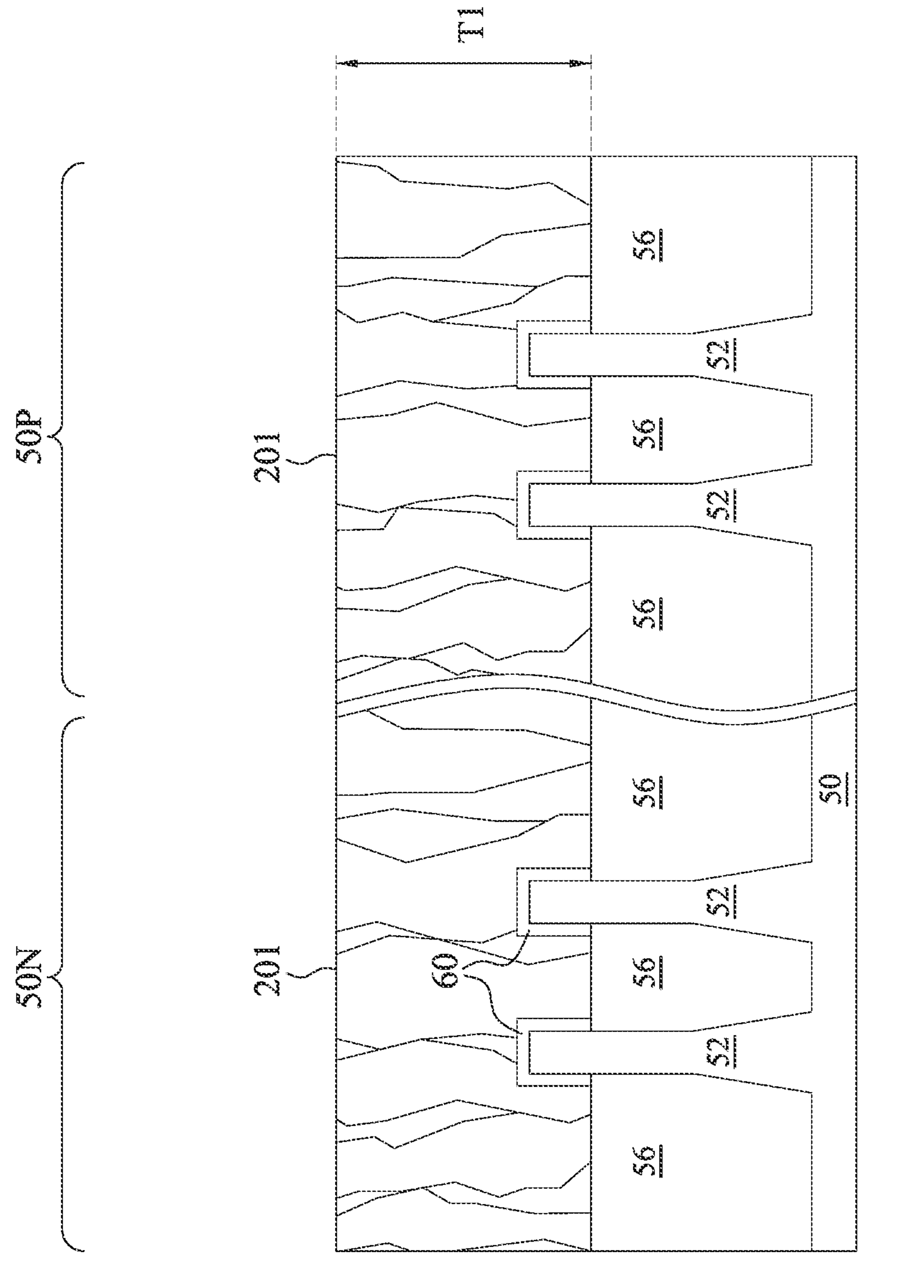
FIGS. 22, 23, 24, 25, 26, 27A, 27B, 28A, 28B, 29A, 29B, 30A, and 30B are cross-sectional views of intermediate stages in the manufacturing of FinFETs, in accordance with some embodiments.

Turning to FIG. 22, a polycrystalline layer 201 is deposited over the dummy dielectric layer 60 (e.g., over the fins 52 and the STI regions 56). The polycrystalline layer 201 may be formed using a process such as PVD, CVD, or the like. In some cases, the polycrystalline layer 201 may be similar to the example dummy gate layer 162 described previously for FIG. 12B. As such, the polycrystalline layer 201 may comprise relatively large grains, such as the long columnar grains shown in FIG. 22. The polycrystalline layer 201 may comprise a material such as silicon, germanium, silicon germanium (SiGe), or the like. In some embodiments, the polycrystalline layer 201 may be deposited to a thickness T1 in the range of about 80 nm to about 100 μm, though other thicknesses are possible.

Figure 23:
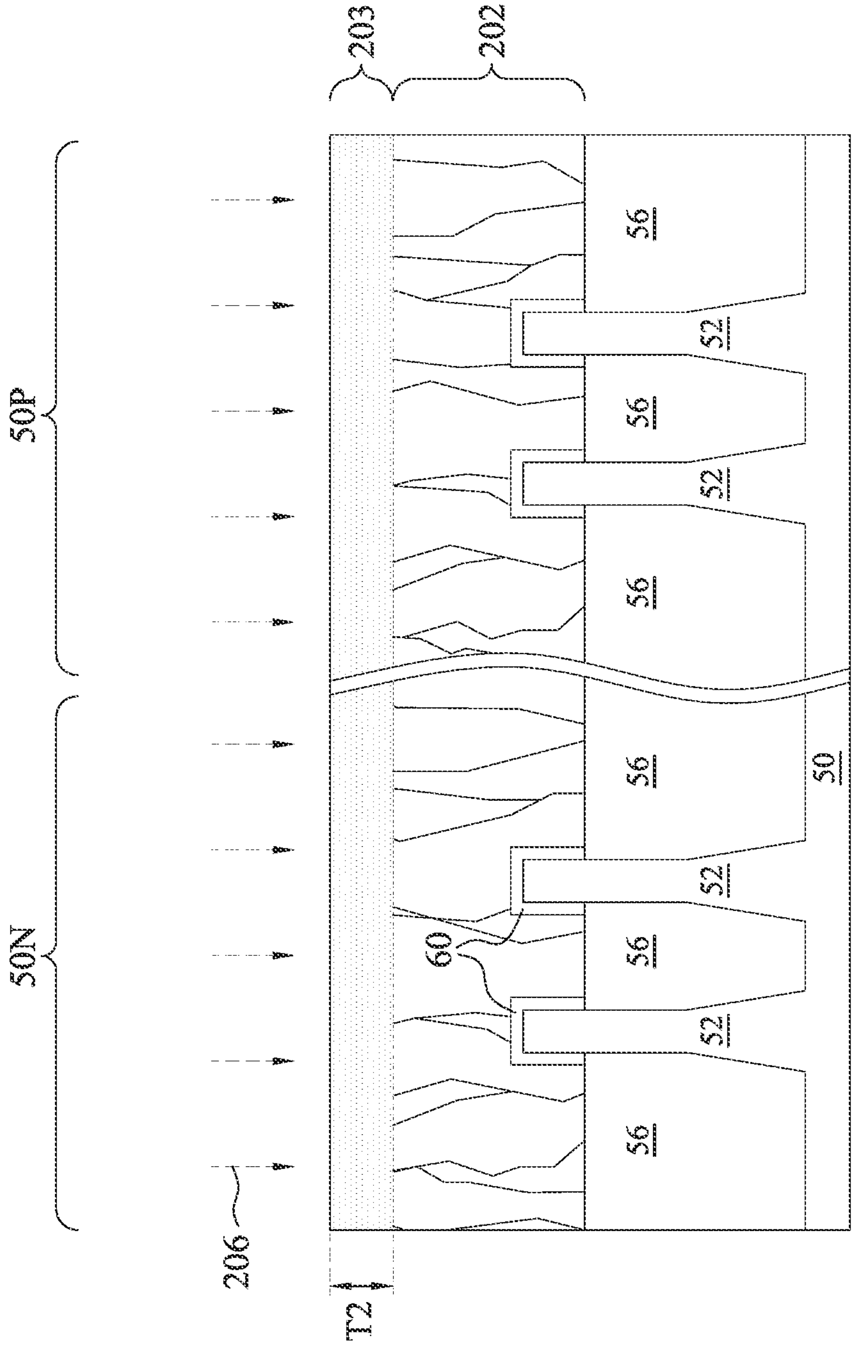

In FIG. 23, an implantation process 206 is performed to form an amorphous region 203 in the polycrystalline layer 201, in accordance with some embodiments. The implantation process 206 amorphizes an upper region of the polycrystalline layer 201, forming the amorphous region 203. The lower region of the polycrystalline layer 201 that is not amorphized is referred to herein as the polycrystalline region 202. The implantation process 206 may comprise implantation species such as silicon, nitrogen, arsenic, argon, phosphorus, boron, antimony, indium, germanium, the like, or a combination thereof. The implantation energy may be in the range from about 7 keV to about 160 keV, and the implantation dose may be in the range from about 1014 atoms/cm2 to about 5×1015 atoms/cm2 or greater. Other implantation species or parameters are possible.

In some embodiments, the amorphous region 203 may have a thickness T2 in the range of about 20 nm to about 200 nm, though other thicknesses are possible. The amorphous region 203 is shown in FIG. 23 as having an approximately uniform thickness, but in some cases, different portions of the amorphous region 203 may have different thicknesses with the overall average thickness of the amorphous region 203 being the thickness T2. In some embodiments, the thickness T2 of the amorphous region 203 is between about 1% and about 50% of the thickness T1 of the polycrystalline layer 201. In some embodiments, the thickness T2 may be controlled by controlling the parameters (e.g., energy, dose, or the like) of the implantation process 206.

Figure 24:
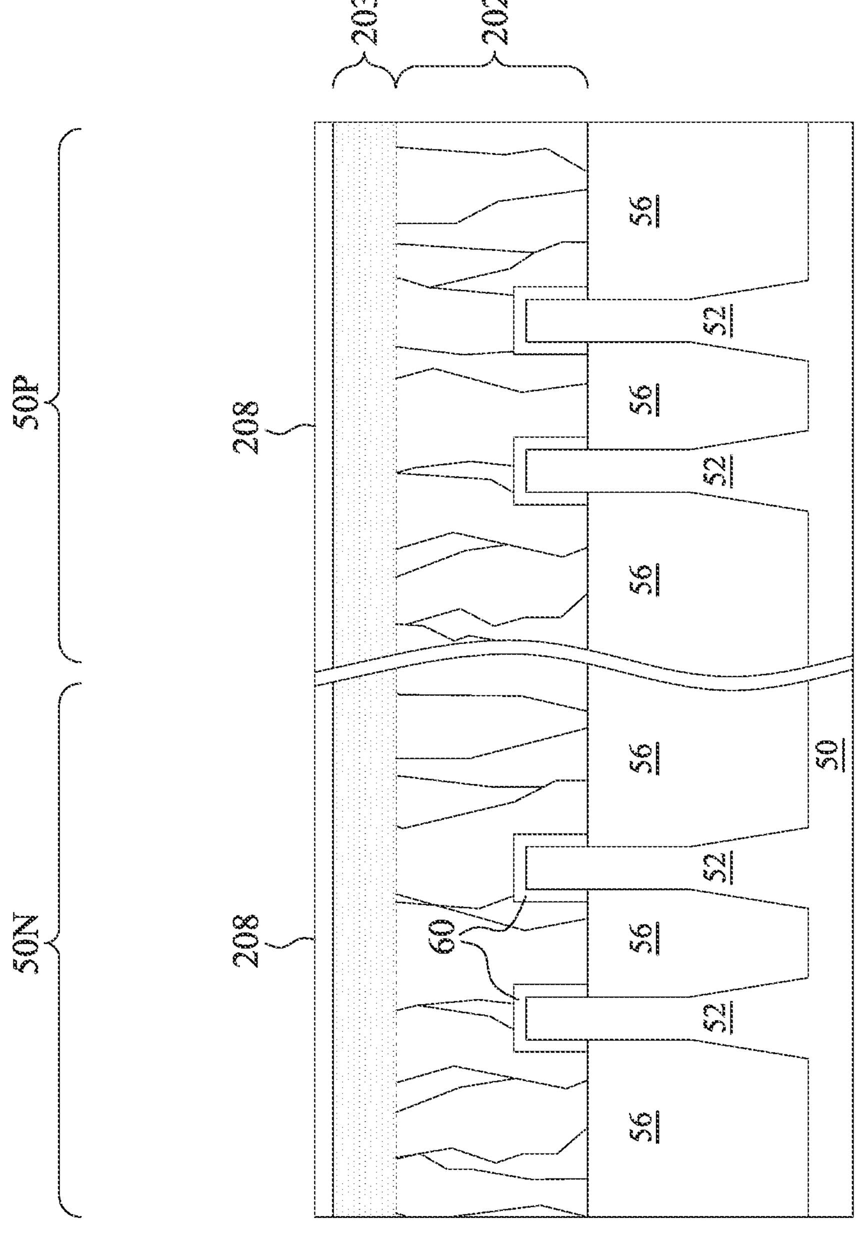

In FIG. 24, a capping layer 208 is formed on the amorphous region 203, in accordance with some embodiments. The capping layer 208 is formed to promote the formation of small grains during a fast-ramp anneal process 210 that recrystallizes the amorphous region 203, described in greater detail below. In some embodiments, the capping layer 208 may comprise a dielectric material such as silicon oxide, silicon nitride, silicon oxynitride, silicon oxycarbonitride, the like, or a combination thereof. In some embodiments, the capping layer 208 may comprise a metal oxide or high-k material, such as hafnium oxide, zirconium oxide, aluminum oxide, lanthanum oxide, the like, or a combination thereof. The capping layer 208 may be formed using a suitable technique, such as CVD, ALD, or the like. In some embodiments, the capping layer 208 has a thickness in the range of about 10 Å to about 100 nm, though other thicknesses are possible.

Figure 25:
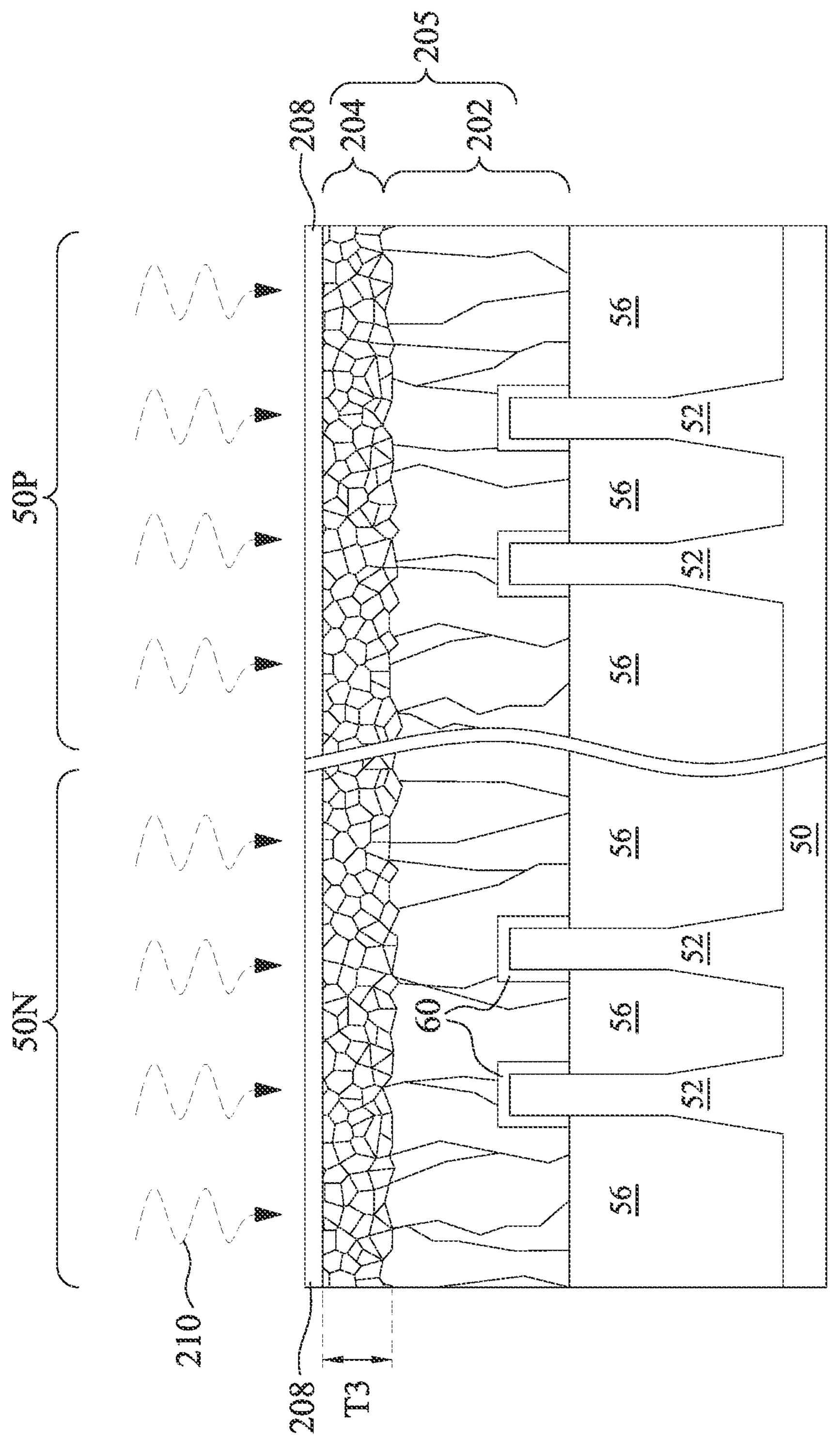

In FIG. 25, a fast-ramp anneal process 210 is performed to form a recrystallized region 204 from the amorphous region 203, in accordance with some embodiments. In some embodiments, the fast-ramp anneal process 210 is a thermal process that recrystallizes the amorphous region 203 from amorphous material to a recrystallized region 204 comprising polycrystalline material, described in greater detail below. In some cases, forming the capping layer 208 on the amorphous region 203 can promote the formation of a recrystallized region 204 having relatively small grains. For example, the interface between the capping layer 208 and the amorphous region 203 may provide nucleation sites for grain formation during recrystallization by the fast-ramp anneal process 210. The nucleation sites allow for the growth of relatively small grains during the recrystallization of the amorphous region 203, whereas without the presence of the capping layer 208, the amorphous region 203 may be more likely to recrystallize into relatively large grains or columnar grains similar to those of the polycrystalline region 202.

In this manner, the use of a capping layer 208 can form a polycrystalline hybrid-grain layer 205 comprising an upper recrystallized region 204 having relatively small grains and a lower polycrystalline region 202 having relatively large grains. In some embodiments, the recrystallized region 204 may comprise grains having dimensions in the range of about 5 nm to about 50 nm, though other sizes are possible.

In some embodiments, the average grain size of the recrystallized region 204 may be between about 1% and about 5% of the average grain size of the polycrystalline region 202, though other proportions are possible. The recrystallized region 204 may have a thickness T3 that is approximately the same as the thickness T2 of the amorphous region 203, in some cases.

The fast-ramp anneal process 210 may be similar to the fast-ramp anneal process 63 described previously, and may be performed using similar techniques. In some embodiments, the temperature of the fast-ramp anneal process 210 is in the range of about 900° C. to about 1400° C., though other temperatures are possible. In some embodiments, the temperature ramping rate of the fast-ramp anneal process 210 is in the range of about $10^{5\circ}$ C./second to about $10^{6\circ}$ C./second, though other ramping rates are possible. In some embodiments, the fast-ramp anneal process 210 is performed for a duration of time that is in the range of about 0.1 milliseconds to about 1 millisecond, though other durations of time are possible. For example, in some embodiments, the fast-ramp anneal process 210 comprises increasing the annealing temperature at a rate greater than about $10^{5\circ}$ C./second to a final annealing temperature and then maintaining the annealing temperature for less than about 1 millisecond.

Figure 26:
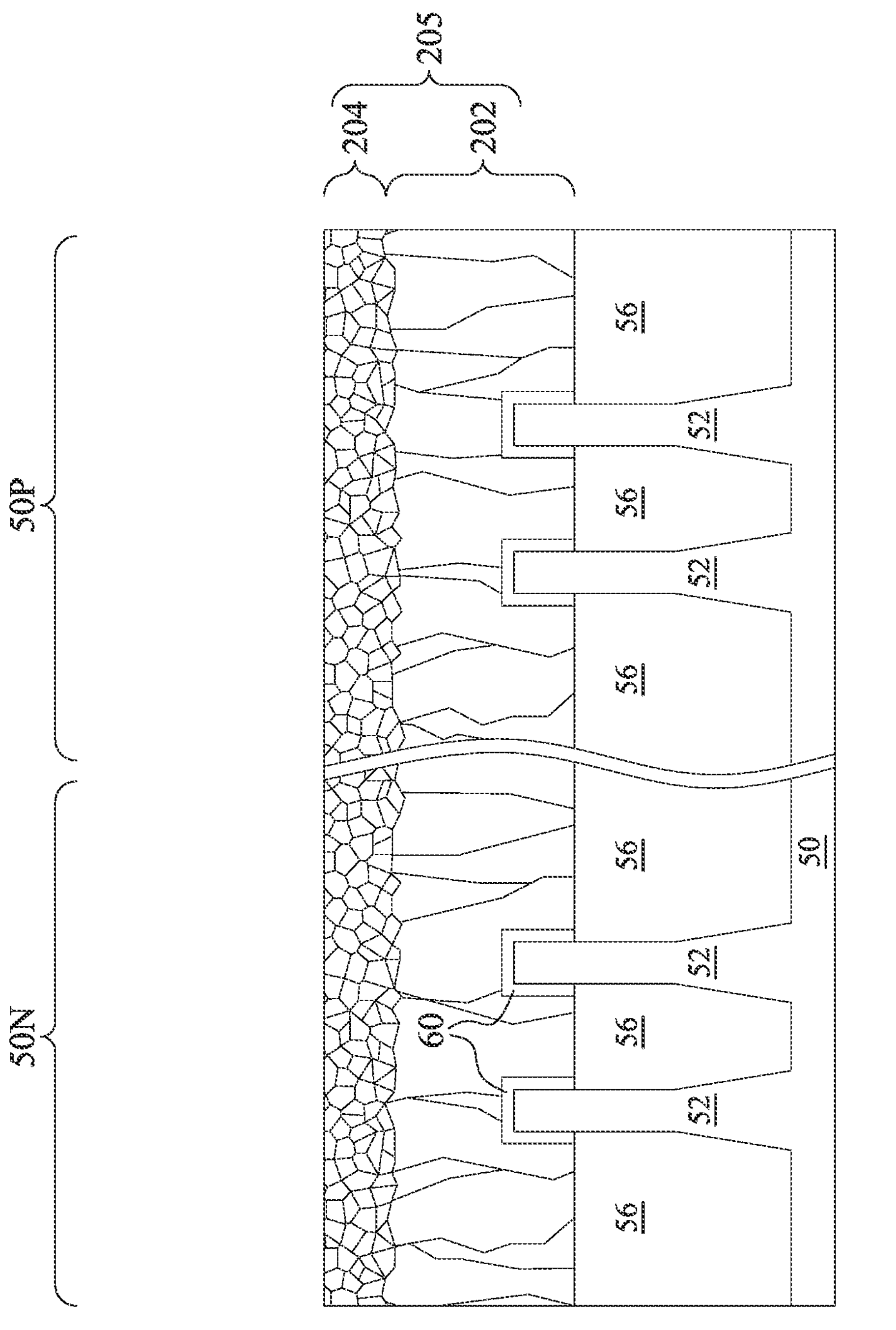

Turning to FIG. 26, the capping layer 208 is removed, in accordance with some embodiments. The capping layer 208 may be removed, for example, using a suitable wet etching process or dry etching process. For example, the capping layer 208 may be removed using a selective etching process that preferentially etches the material of the capping layer 208 rather than the material of the hybrid-grain layer 205. In some embodiments, the structure shown in FIG. 26 may be similar to the structure shown in FIG. 10, except that the hybrid-grain layer 205 is used in place of the dummy gate layer 62 and the mask layer 64.

Figure 27B:
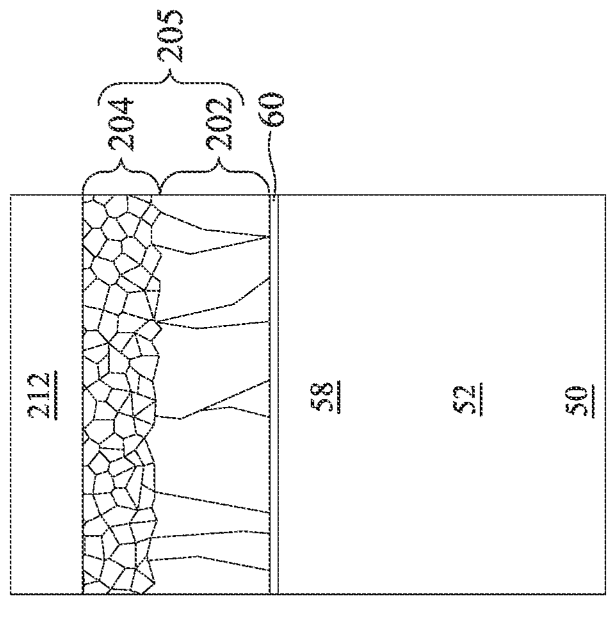
Figure 27A:
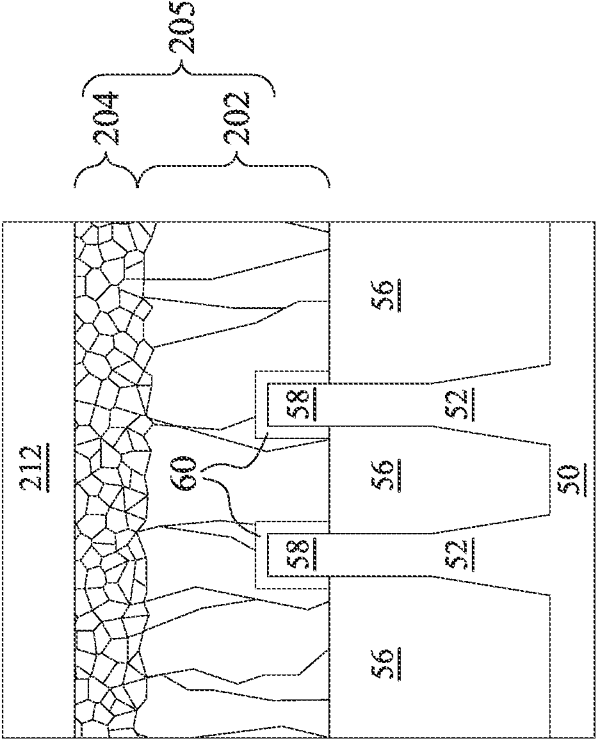

FIGS. 27A through 30B illustrate cross-sections of intermediate steps in the patterning of the hybrid-grain layer 205 to form a hybrid-grain dummy gate 207 (see FIGS. 29A and 29B), in accordance with some embodiments. In FIGS. 27A and 27B, a photoresist layer 212 is formed over the hybrid-grain layer 205. The photoresist layer 212 may be formed using a suitable technique, such as by a spin-on process or the like. In some cases, the photoresist layer 212 may adhere better to a polycrystalline material having relatively small grains than to a polycrystalline material having relatively large grains. In this manner, forming a recrystallized region 204 having relatively small grains as described herein can improve the adhesion of an overlying photoresist layer 212, which can improve patterning of the hybrid-grain layer 205 to form hybrid-grain dummy gates 207, described below.

Figure 28B:
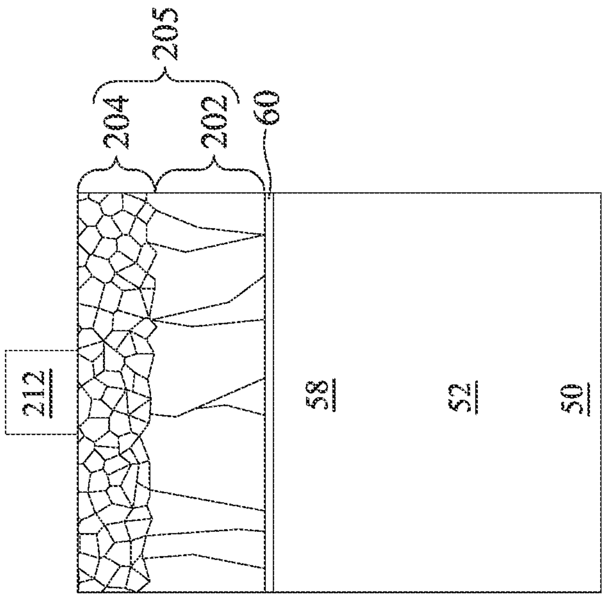
Figure 28A:
Figure 28A:
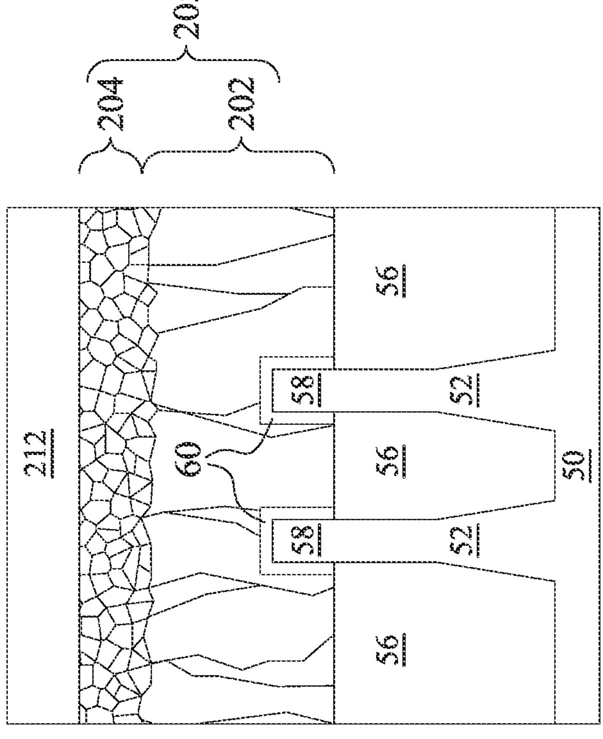

In FIGS. 28A and 28B, the photoresist layer 212 is patterned using acceptable photolithography techniques. The pattern of the photoresist layer 212 corresponds to the pattern of the subsequently formed hybrid-grain dummy gates 207 (see FIGS. 29A-29B), in accordance with some embodiments. In some cases, the stronger adhesion of the photoresist layer 212 to the recrystallized region 204 can improve the patterning of the photoresist 212, such as by reducing line edge roughness, improving pattern definition (e.g., reduce pattern distortion), or reducing the chance of defects. Additionally, in some cases, the relatively small grains of the recrystallized region 204 allow for increased light absorption and reduced light reflection by the recrystallized region 204 during a photolithography process. In this manner, the recrystallized region 204 can act effectively as a Bottom Anti-Reflective Coating (BARC) underneath the photoresist layer 212. In some cases, the anti-reflective properties of the recrystallized region 204 may obviate the need to deposit a separate BARC to reduce light reflection. By reducing light reflection without depositing a separate BARC, fewer process steps may be required and manufacturing cost may be reduced. Additionally, depositing the photoresist layer 212 directly on the hybrid-grain layer 205 rather than on a BARC may improve pattern definition (e.g., reduce pattern distortion), reduce pattern roughness, or reduce linewidth of the subsequently patterned hybrid-grain dummy gates 207 (see FIGS. 28A-29B).

Figure 29B:
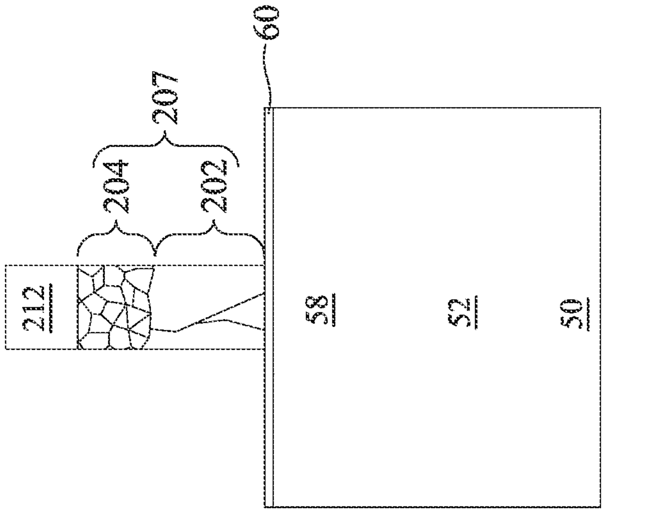
Figure 29A:
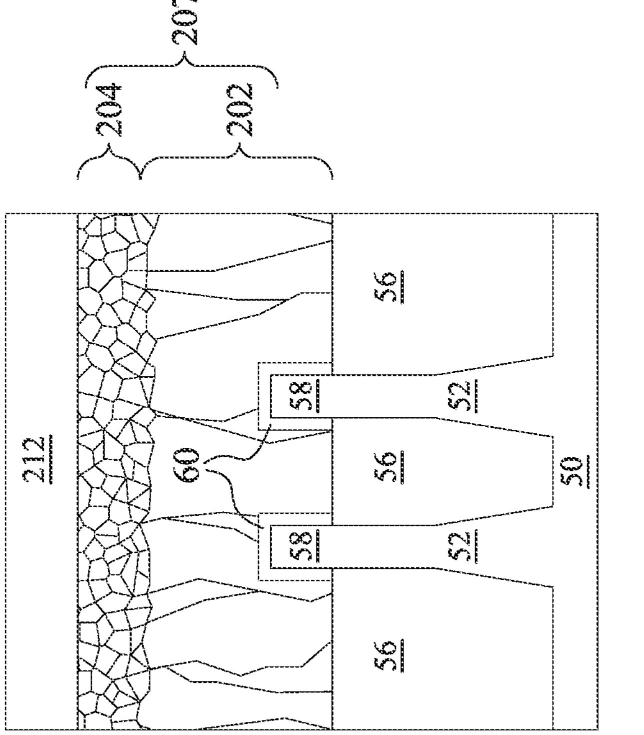

In FIGS. 29A and 29B, the hybrid-grain layer 205 is patterned to form hybrid-grain dummy gates 207, in accordance with some embodiments. The pattern of the patterned photoresist layer 212 (see FIGS. 28A-28B) may be transferred to the hybrid-grain layer 205 using an acceptable etching technique, which may be similar to the etching technique(s) described previously for FIGS. 11A-11B. For example, the etching technique may include an anisotropic dry etch and/or an anisotropic wet etch. In some cases, the formation of a hybrid-grain layer 205 comprising a recrystallized region 204 having small, uniform grains can allow for improved etching of the hybrid-grain layer 205. For example, similar to the description for FIGS. 12A-12B and 13A-13B, the relatively small grains of the recrystallized region 204 can allow for improved reproducibility, uniformity, or linewidth control of patterned features such as hybrid-grain dummy gates 207 or the like. The use of a hybrid-grain layer 205 with a small-grain recrystallized region 204 can also reduce linewidth roughness and/or line edge roughness, in some cases.

Figure 30B:
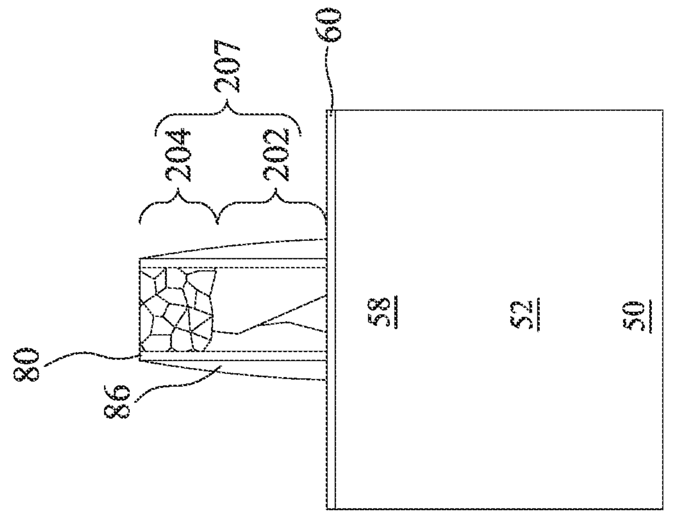
Figure 30A:
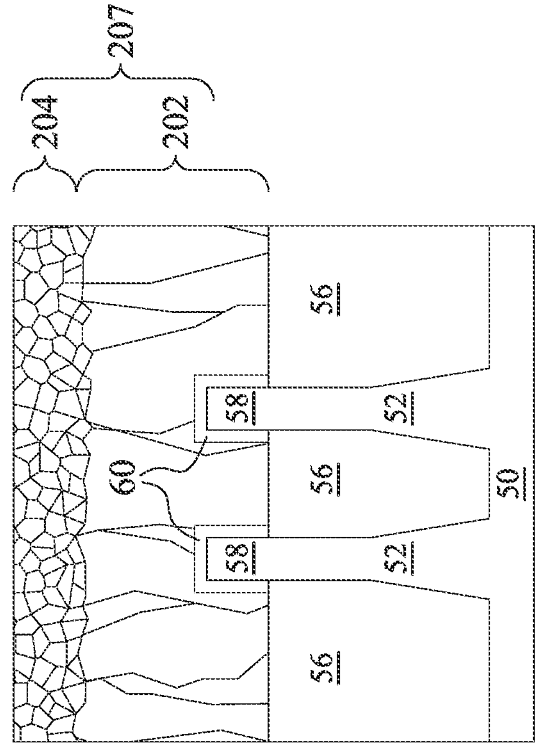

In FIGS. 30A and 30B, gate seal spacers 80 and gate spacers 86 are formed on the hybrid-grain dummy gates 207, in accordance with some embodiments. The structures shown in FIGS. 30A-30B may be similar to the structures shown in FIGS. 14A-14B, except that the hybrid-grain dummy gates 207 are used in place of the dummy gates 72 and masks 74. The gate seal spacers 80 and gate spacers 86 may be similar to those described previously for FIGS. 14A-14B, and may be formed in a similar manner. For example, gate seal spacers 80 may be formed on exposed surfaces of the hybrid-grain dummy gates 207 and/or the fins 52. In some embodiments, implants for lightly doped source/drain (LDD) regions may be performed after the formation of the gate seal spacers 80. Gate spacers 86 may then be formed on the gate seal spacers 80 along sidewalls of the hybrid-grain dummy gates 207.

The structures shown in FIGS. 30A-30B may then be further processed to form FinFETs (not shown in the Figures), in accordance with some embodiments. For example, process steps similar to those described previously for FIGS. 15A through 21B may be performed, except that the hybrid-grain dummy gates 207 are used in place of the masks 74 and dummy gates 72. Other subsequent processing steps are possible.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks are formed in a manner similar to the above-described embodiments. For example, forming the dummy gate stacks may include depositing an amorphous layer and then recrystallizing the amorphous layer into a small-grain polycrystalline material using a fast-ramp anneal process. Source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

The embodiments described here have some advantages. The techniques described herein allow for improved patterning of features such as dummy gates. The use of a fast-ramp anneal process as described herein can recrystallize an amorphous material into polycrystalline material having a grain structure that is less sensitive to surface geometry. In this manner, the polycrystalline material may be formed having smaller, more uniform grains. A capping layer formed over an amorphous material may form a polycrystalline material having smaller, more uniform grains by providing nucleation sites for grain growth. The smaller, more uniform grains allow the polycrystalline material to be etched more uniformly, forming etched sidewalls having less roughness and less profile variation. This allows for the formation of features (e.g., gate stacks) having smaller linewidth, more uniform width, and less linewidth roughness. In some cases, a polycrystalline material having smaller grains may have improved photoresist adhesion and may have anti-reflective properties, which can allow for improved photolithographic patterning.

In accordance with some embodiments of the present disclosure, a method includes forming a fin protruding from a semiconductor substrate; forming a dummy gate stack over the fin, wherein forming the dummy gate stack includes depositing a layer of amorphous material over the fin; performing an anneal process on the layer of amorphous material, wherein the anneal process recrystallizes the layer of amorphous material into a layer of polycrystalline material, wherein the anneal process includes heating the layer of amorphous material for less than one millisecond; and patterning the layer of polycrystalline material; forming an epitaxial source/drain region in the fin adjacent the dummy gate stack; and removing the dummy gate stack and replacing the dummy gate stack with a replacement gate stack. In an embodiment, the amorphous material is a metal oxide. In an embodiment, the anneal process includes heating the layer of amorphous material at a temperature in the range of 1100° C. to 1600° C. In an embodiment, the polycrystalline material is silicon germanium. In an embodiment, the anneal process includes heating the layer of amorphous material at a temperature in the range of 900° C. to 1300° C. In an embodiment, the anneal process includes increasing the anneal temperature at a rate in the range of 105° C./second to 106° C./second. In an embodiment, the grains of the layer of polycrystalline material have a size that is within ±8% of the average grain size of the polycrystalline material. In an embodiment, the average grain size of the layer of polycrystalline material is in the range of 5 nm to 50 nm.

In accordance with some embodiments of the present disclosure, a method includes forming a fin protruding from a substrate; forming a dummy gate layer over the substrate, wherein the dummy gate layer covers the fin, wherein the dummy gate layer includes an amorphous material; performing a thermal process on the dummy gate layer, wherein after performing the thermal process the dummy gate layer includes a polycrystalline region, wherein the crystalline grains of the polycrystalline region each have a dimension less than 50 nm; patterning the dummy gate layer to form a dummy gate extending over the fin; forming an isolation region surrounding the dummy gate; removing the dummy gate to form a recess; and forming a gate structure in the recess. In an embodiment, forming the dummy gate layer includes depositing a polycrystalline material over the substrate and performing an implantation process on the polycrystalline material to form an amorphous region comprising the amorphous material. In an embodiment, the method includes: prior to performing the thermal process, forming a capping layer on the amorphous region; and prior to patterning the dummy gate layer, removing the capping layer. In an embodiment, the method includes forming a mask layer on the dummy gate layer after performing the thermal process on the dummy gate layer. In an embodiment, the dummy gate has a linewidth roughness in the range of 0.1 nm to 2 nm. In an embodiment, the thermal process is performed for a duration of time in the range of 0.1 milliseconds to 1 millisecond. In an embodiment, the amorphous material is a metal. In an embodiment, the thermal process is a laser annealing process.

In accordance with some embodiments of the present disclosure, a method includes depositing amorphous silicon over a semiconductor fin; annealing the amorphous silicon, wherein the annealing recrystallizes the amorphous silicon into polysilicon comprising crystalline grains, wherein the annealing includes increasing an annealing temperature to a final annealing temperature at a rate greater than $10^{5}$° C./second; and maintaining the final annealing temperature for less than one millisecond; etching the polysilicon to form a dummy structure over the semiconductor fin; and replacing the dummy structure with a gate structure. In an embodiment, the final annealing temperature is between 900° C. and 1400° C. In an embodiment, the crystalline grains in a region near the top of the dummy structure have a first average size, and wherein the crystalline grains in a region near the semiconductor fin have the first average size. In an embodiment, the first average size is in the range of 5 nm to 50 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a fin protruding from a semiconductor substrate;

forming a dummy gate stack over the fin, wherein forming the dummy gate stack comprises:

forming a first polycrystalline layer over the fin;

depositing a layer of amorphous material over the fin, comprising performing an implantation process on the first polycrystalline layer;

forming an oxide layer over the layer of amorphous material;

performing an anneal process on the layer of amorphous material, wherein the anneal process recrystallizes the layer of amorphous material into a second layer of polycrystalline material, wherein the anneal process comprises heating the layer of amorphous material for less than one millisecond; and patterning the first layer of polycrystalline material and the second layer of polycrystalline material;

forming an epitaxial source/drain region in the fin adjacent the dummy gate stack; and removing the dummy gate stack and replacing the dummy gate stack with a replacement gate stack.

2. The method of claim 1, wherein the amorphous material is a metal oxide.

3. The method of claim 2, wherein the anneal process comprises heating the layer of amorphous material at a temperature in the range of 1100° C. to 1600° C.

4. The method of claim 1, wherein the first layer of polycrystalline material is silicon germanium.

5. The method of claim 4, wherein the anneal process comprises heating the layer of amorphous material at a temperature in the range of 900° C. to 1300° C.

6. The method of claim 1, wherein the anneal process comprises increasing an anneal temperature at a rate in the range of 105° C./second to 106° C./second.

7. The method of claim 1, wherein an average grain size of the second layer of polycrystalline material is smaller than the average grain size of the first layer of polycrystalline material in the range of 5 nm to 50 nm.

8. The method of claim 1 further comprising, before patterning the first layer of polycrystalline material and the second layer of polycrystalline material, removing the oxide layer.

9. A method comprising:

forming a fin protruding from a substrate;

forming a dummy gate layer over the substrate, wherein the dummy gate layer covers the fin, wherein the dummy gate layer comprises an amorphous material;

forming a capping layer covering the amorphous material of the dummy gate layer;

after forming the capping layer, performing a thermal process on the dummy gate layer, wherein after performing the thermal process the dummy gate layer comprises an upper polycrystalline region, wherein crystalline grains of the upper polycrystalline region each have a dimension less than 50 nm;

after performing the thermal process, removing the capping layer;

patterning the dummy gate layer to form a dummy gate extending over the fin;

forming an isolation region surrounding the dummy gate;

removing the dummy gate to form a recess; and forming a gate structure in the recess.

10. The method of claim 9, wherein forming the dummy gate layer comprises:

depositing a polycrystalline material over the substrate; and performing an implantation process on the polycrystalline material to form an amorphous region comprising the amorphous material.

11. The method of claim 9 further comprising forming a mask layer on the dummy gate layer after performing the thermal process on the dummy gate layer.

12. The method of claim 9, wherein the dummy gate has a linewidth roughness in the range of 0.1 nm to 2 nm.

13. The method of claim 9, wherein the thermal process is performed for a duration of time in the range of 0.1 milliseconds to 1 millisecond.

14. The method of claim 9, wherein the amorphous material is a metal.

15. The method of claim 9, wherein the thermal process is a laser annealing process.

16. A method of forming a semiconductor device, the method comprising:

forming an epitaxial source/drain region in a semiconductor fin;

depositing polysilicon over the semiconductor fin;

amorphizing a region of the polysilicon to form an amorphous silicon layer over the semiconductor fin;

depositing a capping layer on the amorphous silicon layer;

annealing the amorphous silicon layer, wherein the annealing recrystallizes the amorphous silicon into polysilicon comprising crystalline grains, wherein the annealing comprises:

increasing an annealing temperature to a final annealing temperature at a rate greater than 105° C./second; and maintaining the final annealing temperature for less than one millisecond;

etching the polysilicon to form a dummy structure over the semiconductor fin; and replacing the dummy structure with a gate structure.

17. The method of claim 16, wherein the final annealing temperature is between 900° C. and 1400° C.

18. The method of claim 16, wherein the crystalline grains of the polysilicon in a region near the top of the dummy structure have a first average size, and wherein the crystalline grains in a region near the semiconductor fin have a second average size larger than the first average size.

19. The method of claim 18, wherein the first average size is in the range of 5 nm to 50 nm.

20. The method of claim 16 further comprising fully removing the capping layer.

* * * * *